United States Patent
Postol

(10) Patent No.: US 6,404,820 B1
(45) Date of Patent: Jun. 11, 2002

(54) METHOD FOR STORAGE AND RECONSTRUCTION OF THE EXTENDED HAMMING CODE FOR AN 8-DIMENSIONAL LATTICE QUANTIZER

(75) Inventor: Michael Samuel Postol, Potomac, MD (US)

(73) Assignee: The United States of America as represented by the Director of the National Security Agency, Washington, DC (US)

( * ) Notice: Subject to any disclaimer, the term of this patent is extended or adjusted under 35 U.S.C. 154(b) by 0 days.

(21) Appl. No.: 09/351,047

(22) Filed: Jul. 9, 1999

(51) Int. Cl.[7] ............................................... H04L 27/00
(52) U.S. Cl. ............ 375/259; 375/240.03; 375/240.22; 375/240.24; 375/245; 375/265; 714/701; 714/777; 714/792; 341/200
(58) Field of Search ........................ 375/240.03, 240.22, 375/240.23, 243, 240.24, 245, 259, 265; 714/701, 759, 777, 792; 341/51, 200

(56) References Cited

U.S. PATENT DOCUMENTS

| | | | |
|---|---|---|---|
| 5,150,209 A | | 9/1992 | Baker et al. |
| 5,297,170 A | * | 3/1994 | Eyuboglu et al. ............ 375/241 |
| 5,883,981 A | * | 3/1999 | Li et al. ...................... 382/248 |
| 6,082,340 A | * | 7/2000 | Postol ......................... 341/200 |
| 6,084,534 A | * | 7/2000 | Postol ......................... 341/107 |

OTHER PUBLICATIONS

Conway, John H. & Sloane, N.J.A, Soft Decoding Techniques for Codes & Lattices, Including the Golay Code & Leech Lattice, IEEE Trans. on INFO. Theory, vol. IT–32, No. 1, Jan. '86.

Conway, John H. & Sloane, N.J.A, "Fast Quantizing & Decoding Algorithms for Lattice Quantizers & Codes" IEEE Tran. on INFO. Theory, vol. IT–28, No. 2, Mar. '82.

Conway, J. H. & Sloane, N.J.A., Fast–4–& 8–Dimensional Quantizers & Decoders, IEEE CH 1679–0181, 1981.

Postol, Michael Samuel, "Method of Lattice Quantization That Minimizes Storage Requirements & Computational Complexity," U.S. Patent Application 09/096,375, filed Jun. 12, 98 Does Not Disclose the Extended Quadratic Residue Code Mode.

* cited by examiner

*Primary Examiner*—Chi Pham
*Assistant Examiner*—Khanh cong Tran
(74) *Attorney, Agent, or Firm*—Stephen M. Bloor

(57) ABSTRACT

A method of lattice-quantizing an eight-long data point to minimize storage requirements by acquiring the data point, multiplying each coordinate of the data point by $\sqrt{2}$ to form an inflated data point, rounding each coordinate of the rounded and inflated data point to the nearest integer, modulo-two reducing each coordinate of the rounded and inflated data point to form an initial codeword, multiplying a parity-check matrix of an eight-bit Extended Hamming Code by the result of the last step to form a syndrome, correcting any single-bit errors and double-bit errors, if any, in the initial codeword and the rounded and inflated data point, transforming the coordinate system of the initial codeword to an extended quadratic residue form, creating a signal packet, and transmitting the signal packet to a receiver. The receiver receives the signal packet, recovers the intended Extended Hamming Code codeword by a reverse transform of lattice coordinates, modifies the codeword according to the signal packet in order to recover the rounded and inflated data point, replaces each 1 in the rounded and inflated data point by $1/\sqrt{2}$ of the same polarity, and each 2 by $\sqrt{2}$ of the same polarity in order to recover the data point.

5 Claims, 13 Drawing Sheets

Lattice-Quantizing a 8-Bit Data Point for Transmission

Lattice-Quantizing a 8-Bit Data Point for Transmission

Transmission of an All-0s Codeword in Shell 1

Transmission of an All-0s Codeword in Shell 2

Transmission of an All-1s Codeword in Shell 2

Transmission of a Weight-Four Codeword in Shell 1

Transmission of a Weight-Four Codeword in Shell 2

Reception of an All-0s Codeword in Shell 1

Reception of an All-0s Codeword in Shell 2

Reception of an All-1s Codeword in Shell 2

Reception of a Weight-Four Codeword in Shell 1

Reception of a Weight-Four Codeword in Shell 2

Encoding of Extended Quadratic Code Mode Codeword for Transmission

Decoding of Extended Quadratic Code Mode Codeword for Reception

METHOD FOR STORAGE AND RECONSTRUCTION OF THE EXTENDED HAMMING CODE FOR AN 8-DIMENSIONAL LATTICE QUANTIZER

FIELD OF THE INVENTION

The present invention, a method of efficient storage and reconstruction of the codewords of the Extended Hamming Code, relates to pulse or digital communications and, more particularly, to a quantizer or inverse quantizer.

BACKGROUND OF THE INVENTION

A quantizer is a device for converting numerical data into a finite number of possible outputs. That is, the input to a quantizer may be any value, but the output of a quantizer is limited to only certain values. The function of a quantizer is to determine which of its possible output values is closest to the input value and put out that value. For example, a flip-flop puts out either a voltage equal to the power supply voltage connected to the flip-flop (e.g., five volts or a logic one) or a voltage equal to the ground voltage connected to the flip-flop (e.g., zero volts or a logic zero). The input to a flip-flop may be any value between ground voltage and the power supply voltage. The flip-flop determines which of its two possible output values is closest to the input value and puts out that value. Typically, an input voltage greater than or equal to one-half of the power supply voltage will cause a flip-flop to put out the power supply voltage (i.e., a logic one) while an input voltage below one-half of the power supply voltage will cause a flip-flop to put out the ground voltage (i.e., a logic zero).

Quantizers are used in the design of signals for use over a noisy channel. Analog to Digital converters convert complex analog signals (e.g., 0.654783V) into simplistic digital signals (e.g., logic 1). This is a form of data compression. An area centered at one of the allowable outputs is called a Voronoi region. If the quantizer receives a point in this region, it converts it, if necessary, to the allowable point in the center of the region.

Quantizers come in two types, scalar quantizers and vector quantizers. A scalar quantizer quantizes data from a single source by rounding a real number to its nearest output value (e.g., a flip-flop). A vector quantizer quantizes data from multiple sources by choosing one point from a finite set of points in n-dimensional space that is closest to the point represented by the input vector. A point in n-dimensional space is simply a string of n real numbers. That is, $x=(x_1, x_2, x_3, \ldots, x_n)$. For example, a point in three dimensional space is a point represented by three coordinates, a point in four dimensional space is a point represented by four coordinates, and so on. The allowed output values of a vector quantizer are called centroids.

The present invention concerns a lattice quantizer. A lattice in n-dimensional space is defined as follows. Let $(v_1, v_2, \ldots, v_n)$ be a set of n linearly independent vectors in n-dimensional space. The lattice generated by $(v_1, v_2, \ldots, v_n)$ is the set $(c_1 v_1 + c_2 v_2 + \ldots + c_n v_n)$, where $c_1, \ldots, c_n$ are integers. The vectors $v_1, v_2, \ldots, v_n$ form a basis for the lattice. If $x=(x_1, x_2, \ldots, x_n)$ then the norm of x is equal to $(x_1^2 + x_2^2 + \ldots + x_n^2)$. A sphere in n-dimensional space with center $u=(u_1, u_2, \ldots, u_n)$ and radius p consists of all the points $x=(x_1, x_2, x_3, \ldots, x_n)$ satisfying $(x_1-u_1)^2 + (x_2-u_2)^2 + \ldots + (x_n-u_n)^2 = p^2$. A sphere packing is described by specifying the centers u and the radius p. When the centers of a group of spheres form a lattice, the packing is referred to as lattice packing. Lattice packing always has a center at a point designated as an origin with the remaining centers on concentric spheres or shells around the origin. The shells are numbered according to their proximity to the center or origin point. That is, the shell closest to the origin point is shell 1; the shell second closest to the origin point is shell 2, and so on. If one lattice may be obtained from another by rotation, reflection, or change of scale then it is said that the lattices are equivalent or similar.

Mathematicians continue to look for dense packings of n-dimensional spheres because there are important practical applications of sphere packing to problems arising in digital communications. A finite subset of the points on the surface of a sphere is called a spherical code. Spherical codes may be constructed from sphere packings. The sphere packing density of a lattice is defined by the number of spheres that fit within a particular volume. The kissing number of a lattice is defined as the number of spheres that a sphere in the lattice touches. The 8-dimensional lattice, designated as E8, has the highest sphere packing density and the highest possible kissing number in eight dimensions.

In a lattice quantizer, the centroids are grid points in n-dimensional space. The advantage of using a lattice quantizer is that the centroids are already known and do not have to be calculated from the input data. The disadvantage of using a lattice quantizer is that there are an infinite number of centroids. Because of this, lattice quantizers are only appropriate for quantizing data that has a probability distribution that is heavily concentrated around a single point in n-dimensional space (e.g., the origin).

Quantizing introduces error. The magnitude of the error is the distance from the received point to the acceptable point. The acceptable points are chosen to minimize the error, or more precisely, to minimize the mean squared error. For various dimensions, the mean squared error has been determined.

Quantizers may be used to design signals for data transmission or storage systems (e.g., error correcting codes). A code is a set of signals to be transmitted. Only these codes will be transmitted over a channel. The members of a code are designed to be easily distinguished from the other members of the code even in the presence of noise. Noise may corrupt a particular member of the code, but it is intended that the corrupted code will be identified as the particular code that was transmitted. So, a message to be sent is encoded, sent over a noisy channel, and decoded to recover the message.

Certain important lattices include the cubic lattice $Z^n$, the root lattices (i.e., An, Dn, E6, E7, and E8), the Coxeter-Todd lattice K12, the sixteen dimensional Barnes-Wall lattice, the 24 dimensional Leech lattice, and their duals. The best quantizers are achieved using these lattices in their respective dimensions.

U.S. Pat. No. 5,150,209, entitled "HIERARCHICAL ENTROPY CODED LATTCE THRESHOLD QUANTIZATION ENCODING METHOD AND APPARATUS FOR IMAGE AND VIDEO COMPRESSION," discloses an eight dimensional lattice quantizer based on the E8 lattice that requires the storage of 920 points to encode and decode 2400 points that do not round to the origin point but instead round to a codeword in either shell 1 or shell 2. A reduction in storage from 2400 to 920 (i.e., a 60% improvement) is achieved using the quantizer of U.S. Pat. No. 5,150,209. The present invention uses a rotated equivalent lattice to improve upon the quantizer of U.S. Pat. No. 5,150,209 by reducing even further the number of points that are stored to encode and decode 2400 points that do not round to the origin point. The present invention reduces the number of codewords that must be stored to 16 in the Extended Hamming Code form or in an alternate extended quadratic residue code form to one codeword. This is a 98% reduction in required codeword storage, or when using the alternate extended quadratic residue code form an approximate 99.9% reduction, over the method of U.S. Pat. No. 5,150,209.

U.S. Pat. No. 5,150,209 is hereby incorporated by reference into the specification of the present invention.

In three articles authored by John H. Conway and N. J. A. Sloane, entitled "Fast 4- and 8-Dimensional Quantizers and Decoders," IEEE, 1981, pp. F4.2.1–F4.2.4, "Fast Quantizing and Decoding Algorithms for Lattice Quantizers and Codes," *IEEE Transactions on Information Theory*, Vol. IT-28, No. 2, March 1982, and "Soft Decoding Techniques for Codes and Lattices, including the Golay Code and the Leech Lattice," *IEEE Transactions on Information Theory*, Vol. IT-32, No. 1, January 1986, mathematical techniques associated with lattice quantizers are disclosed but the present invention, which minimizes the storage requirement and the computational complexity of an eight dimensional lattice quantizer, is not disclosed therein.

SUMMARY OF THE INVENTION

It is an object of the present invention to minimize the storage requirement of an eight-dimensional lattice quantizer.

It is another object of the present invention to require only the storage of sixteen eight-bit words, $\sqrt{2}$, $1/\sqrt{2}$, two tables, and a parity-check matrix in an eight-dimensional lattice quantizer and to reduce the required number of stored eight-bit words to one when using the alternate extended quadratic residue code form of the quantizer.

It is another object of the present invention to minimize the computational complexity of an eight-dimensional lattice quantizer.

It is another object of the present invention to minimize the computational complexity of an eight-dimensional lattice quantizer by requiring only multiplication by $\sqrt{2}$, replacement of 1s by $1/\sqrt{2}$, replacement of 2s by $\sqrt{2}$, and a matrix multiplication.

The present invention is a method of lattice quantization that minimizes the storage requirement and the computational complexity of an eight dimensional lattice quantizer. The idea is to quantize a data point so that it may be transmitted error-free in a noisy channel and reduce bandwidth. This is accomplished, in the Extended Hamming Code form of the invention, by transmitting a data point in the form of information that indicates a codeword of the Extended Hamming Code that is closest to the data point along with information that would allow a receiver to modify the codeword in order to reconstruct the desired data point. The specific steps of the method of the present invention are as follows.

The first step is to acquire an eight dimensional data point.

The second step is to multiply each coordinate of the data point by the square root of two to form an inflated data point.

The third step is to round each coordinate of the inflated data point to the nearest integer to form a rounded and inflated data point.

The fourth step is to find the modulo-two reduction for the absolute value of each coordinate of the rounded and inflated data point to form an initial codeword. If none of the coordinates of the initial codeword are in error then the initial codeword is one of sixteen codewords of the eight-bit Extended Hamming Code. Such a codeword may or may not be equivalent to the rounded and inflated data point. If the codeword is not equivalent to the rounded and inflated data point then additional information, as described below, will be provided to allow a receiver to start with the codeword, modify it according to the additional information in order to recover the rounded and inflated data point, and then deflate the rounded and inflated data point in order to recover a data point that is the closest allowable data point that the lattice quantizer could produce from the acquired data point.

The fifth step is to multiply a parity-check matrix of the eight-bit Extended Hamming Code by the initial codeword. The result of this step is four bits, commonly referred to as a syndrome, that indicate whether or not the initial codeword is error free. The eight-bit Extended Hamming Code allows for the detection and correction of one-bit errors and the detection, but not the correction, of two-bit errors. The present invention improves upon the features of the eight-bit Extended Hamming Code by a method that detects and corrects for both one-bit errors and two-bit errors.

If the result of step five is all-zeros then the initial codeword is error-free and is a codeword of the eight-bit Extended Hamming Code. A signal packet representing the codeword and information required to make any modifications to the codeword in order to reconstruct the rounded and inflated data point on which the codeword was derived is then sent to the receiver. In a subsequent step, the receiver will then recover the intended data point from the recovered rounded and inflated data point. The steps for generating and sending a signal packet are described below.

If the top-most bit of the result of step five is a 1 then one of the binary bits of the initial codeword is wrong. Since the initial codeword is based on the rounded and inflated data point then the bit location in the rounded and inflated data point that corresponds to the bit location in the initial codeword is also wrong. Therefore, the error bit must be corrected in both the rounded and inflated data point and the initial codeword. The corrected rounded and inflated data point will then be the point that is nearest the intended inflated data point. The corrected rounded and inflated data point will indicate what additional information, if any, must be transmitted to the receiver in order for the receiver to reconstruct the rounded and inflated data point from the codeword. The corrected initial codeword will then match one of the sixteen codewords in the Extended Hamming Code. Information representing the corrected codeword will be sent to the receiver in order to allow the receiver to recover the corrected codeword. The other three bits of the result of step five indicate which coordinate in the rounded and inflated data point and which bit in the initial codeword are in error. The error coordinate in the initial codeword is corrected by flipping that bit (i.e., changing a 0 to a 1 or changing a 1 to a 0). The error bit in the rounded and inflated data point is corrected by replacing its value with the value obtained from rounding the opposite way from how that coordinate was originally rounded. For example, if the error coordinate in the rounded and inflated data point is a 1.0 that was based on an inflated data point of 1.3 then the correction would be 2.0. That is, 1.3 originally rounded to the nearest integer 1.0. Since this is in error, then 1.3 should have been rounded the other way to the next closest integer (i.e., 2.0). The error in the rounded and inflated data point, and in the initial codeword, is corrected. Data representing the corrected codeword, and any other information necessary to reconstruct the rounded and inflated data point, is then transmitted to the receiver.

If the top-most bit of the result of step five is a 0 and at least one of the other three bits is a 1 then two of the positions in the rounded and inflated data point and in the initial codeword are wrong. That is, two of the positions in the rounded and inflated data point, and two bits in the initial codeword, must be changed. As above, the corrected rounded and inflated data point yields a point closest to the inflated data point while the corrected codeword yields a codeword in the eight-bit Extended Hamming Code. The other three bits of the result of step five are used to determine which two bits in the rounded and inflated data point and in the initial codeword are wrong. After the two bit locations in the rounded and inflated data point and the initial codeword are identified, the bits in error are corrected as described above. Data representing the corrected codeword and any other information necessary to reconstruct the rounded and inflated data point is then transmitted to the receiver.

The present invention, in the Extended Hamming Code form, stores a table, in both the transmitter and the receiver, that contains the sixteen eight-bit codewords of the eight-bit, or eight-dimensional, Extended Hamming Code. These sixteen codewords are used to represent the 2400 data points in shell 1 and shell 2. This compares very favorably to the 920 codewords stored in U.S. Pat. No. 5,150,209 in order to represent the same number of data points in shell 1 and shell 2. The transmitter and receiver may also store a table that indicates where two 2s may be located in a rounded and inflated data point. Instead of storing a table to identify the location of two 2s, the locations may be determined from an equation representing a particular table construction. The transmitter also stores a parity-check matrix for the eight-bit Extended Hamming Code and the square root of two. The transmitter multiplies the acquired data point by the square root of two in order to form an inflated data point. The transmitter also multiplies the parity-check matrix by the initial codeword. The receiver stores either $1/\sqrt{2}$ or $1/\sqrt{2}$ and $\sqrt{2}$.

In order for the receiver to deflate an inflated data point the receiver either multiplies each coordinate of the inflated data point by $1/\sqrt{2}$ or replaces each 1 by $1/\sqrt{2}$ and each 2 by $\sqrt{2}$. The polarity of the 1s and 2s are also taken into account by setting a polarity bit accordingly. By using the replacement approach, the equivalent of multiplication is achieved more efficiently.

To further reduce codeword storage requirements in the alternate extended quadratic residue code form of the invention, the initial codeword of the eight-bit Extended Hamming Code may be transformed into an equivalent extended quadratic residue code form of the Extended Hamming Code. This extended quadratic residue code form has the property that any weight-four codeword can be obtained from any other weight-four codeword through circularly shifting 7 of its 8 bits, leaving one bit fixed, or the complement of the codeword resulting from such a shift. Because any weight-four codeword can be obtained from any other codeword only one codeword need be stored. Instead of transmitting the position of the codeword in the eight-bit Extended Hamming Code table, as in the Extended Hamming Code form of the invention, information on the number of circular shifts required to obtain the desired extended quadratic residue codeword and a bit to indicate whether the initial codeword was complemented before transformation is transmitted.

To transmit a representation of an all-0s codeword in shell 1, and information necessary to modify the codeword in order to recover the rounded and inflated data point, on which it is based, nine bits are transmitted. Four bits indicate the position in the eight-bit Extended Hamming Code table where the codeword may be found in the Extended Hamming Code form or constitute a special code indicating that the codeword is the all-0s codeword in the alternate extended quadratic residue code form. The receiver initially sets the rounded and inflated data point equal to the codeword and then modifies it according to the other information transmitted in order to reconstruct the intended rounded and inflated data point if different. The other information includes, one bit to indicate that the rounded and inflated data point is in shell 1, three bits to indicate which bit in the rounded and inflated data point should be a 2, and one bit to indicate the polarity of the 2. In order to recover the intended data point each 2 in the recovered rounded and inflated data point is replaced with $\sqrt{2}$.

To transmit a representation of an all-0s codeword in shell 2, and information necessary to modify the codeword to the rounded and inflated data point on which it is based, twelve bits are transmitted. Four bits indicate the position in the eight-bit Extended Hamming Code table where the codeword may be found in the Extended Hamming Code form or constitute a special code indicating that the codeword is the all-0s codeword in the alternate extended quadratic residue code form. Again, the receiver initially sets the rounded and inflated data point equal to the codeword and then modifies it according to the other information sent in order to reconstruct the intended rounded and inflated codeword. The other information includes, one bit to indicate that the rounded and inflated data point is in shell 2, five bits to indicate the position in a table that tells the receiver which two bits in the inflated data point are 2s, one bit to indicate the polarity of the first 2, and one bit to indicate the polarity of the second 2. In order to recover the intended data point each 2 in the recovered rounded and inflated data point is replaced with $\sqrt{2}$ of the same polarity.

To transmit a representation of an all-1's codeword in shell 2, and information necessary to modify it in order to recover the intended rounded and inflated data point, twelve bits are transmitted. The rounded and inflated data point is initially set to the intended codeword and the codeword is modified according to the additional information in order to recover the intended rounded and inflated data point. The rounded and inflated data point is then deflated in order to recover the intended data point. That is, four bits indicate the position in the eight-bit Extended Hamming Code table where the codeword may be found in the Extended Hamming Code form or constitute a special code indicating that the codeword is the all-1s codeword in the alternate extended quadratic residue code form, one bit indicates the polarity of the first 1 in the rounded and inflated data point, one bit indicates the polarity of the second 1 in the rounded and inflated data point, one bit indicates the polarity of the third 1 in the rounded and inflated data point, one bit indicates the polarity of the fourth 1 in the rounded and inflated data point, one bit indicates the polarity of the fifth 1 in the rounded and inflated data point, one bit indicates the polarity of the sixth 1 in the rounded and inflated data point, one bit indicates the polarity of the seventh 1 in the rounded and inflated data point, and one bit indicates the polarity of the eighth 1 in the rounded and inflated data point. In order to recover the intended data point, each 1 in the recovered rounded and inflated data point is replaced with $1/\sqrt{2}$ of the same polarity.

To transmit a representation of a weight-four codeword in shell 1, and information necessary to modify the codeword in order to recover the intended rounded and inflated data point, nine bits are transmitted. That is, four bits indicate the position in the eight-bit Extended Hamming Code table where the codeword may be found in the Extended Hamming Code form or the number of circular shifts required and whether the codeword need be complemented to obtain the desired extended quadratic residue codeword in the alternate extended quadratic residue code form, one bit indicates that the rounded and inflated data point is in shell 1, one bit indicates the polarity of the first 1 in the rounded and inflated data point, one bit indicates the polarity of the second 1 in the rounded and inflated data point, one bit indicates the polarity of the third 1 in the rounded and inflated data point, and one bit indicates the polarity of the fourth 1 in the rounded and inflated data point. In order to recover the intended data point, each 1 in the recovered rounded and inflated data point is replaced with $1/\sqrt{2}$ of the same polarity.

To transmit a representation of a weight-four codeword in shell 2, and information necessary to modify the codeword in order to recover the intended rounded and inflated data point, twelve bits are transmitted. That is, four bits indicate the position in the eight-bit Extended Hamming Code table where the codeword may be found in the Extended Hamming Code form or the number of circular shifts required and whether the codeword need be complemented to obtain the desired extended quadratic residue codeword in the alternate extended quadratic residue code form, one bit indicates that the rounded and inflated data point is in shell 2, one bit indicates the polarity of the first 1 in the rounded and inflated data point, one bit indicates the polarity of the second 1 in the rounded and inflated data point, one bit indicates the polarity of the third 1 in the rounded and inflated data point, one bit indicates the polarity of the fourth 1 in the rounded and inflated data point, two bits to indicate which coordinate in the rounded and inflated data point must be a 2, and one bit indicates the polarity of the 2. In order to recover the intended data point, each 1 in the recovered rounded and inflated data point is replaced with of the same polarity, and each 2 in the recovered rounded and inflated data point is replaced with $1/\sqrt{2}$ of the same polarity.

A signal packet that represents a codeword which is based on a rounded and inflated data point that is closest to the inflated data point, and information necessary to modify the codeword in order to reconstruct the rounded and inflated data point, is then transmitted to a receiver in either the Extended Hamming Code or alternate extended quadratic residue code form of the invention. The receiver decodes the signal packet in order to reconstruct the intended codeword, reconstruct the rounded and inflated data point from the intended codeword, and recovers the intended data point from the rounded and inflated data point. Note that the receiver need store only the table of sixteen codewords of the eight-bit Extended Hamming Code or one codeword of the extended quadratic residue code, a table that lists the twenty-eight different ways that two 2s may appear in a rounded and inflated data point, $1/\sqrt{2}$, and $\sqrt{2}$. In an alternate embodiment, the 2s-position table may be replaced by a function that represents the equation of a suitable 2s-position table.

The aforementioned features, objects, and advantages of this method over the prior art will become apparent to those skilled in the art from the following detailed description and accompanying drawings.

BRIEF DESCRIPTION OF THE DRAWINGS

My invention can best be understood when reading the following specification with reference to the accompanying drawings, which are incorporated in and form a part of the specification, illustrate alternate methods of the present invention, and together with the description, serve to explain the principles of the invention. In the drawings.

DETAILED DESCRIPTION OF THE PREFERRED EMBODIMENTS

Figure 1:
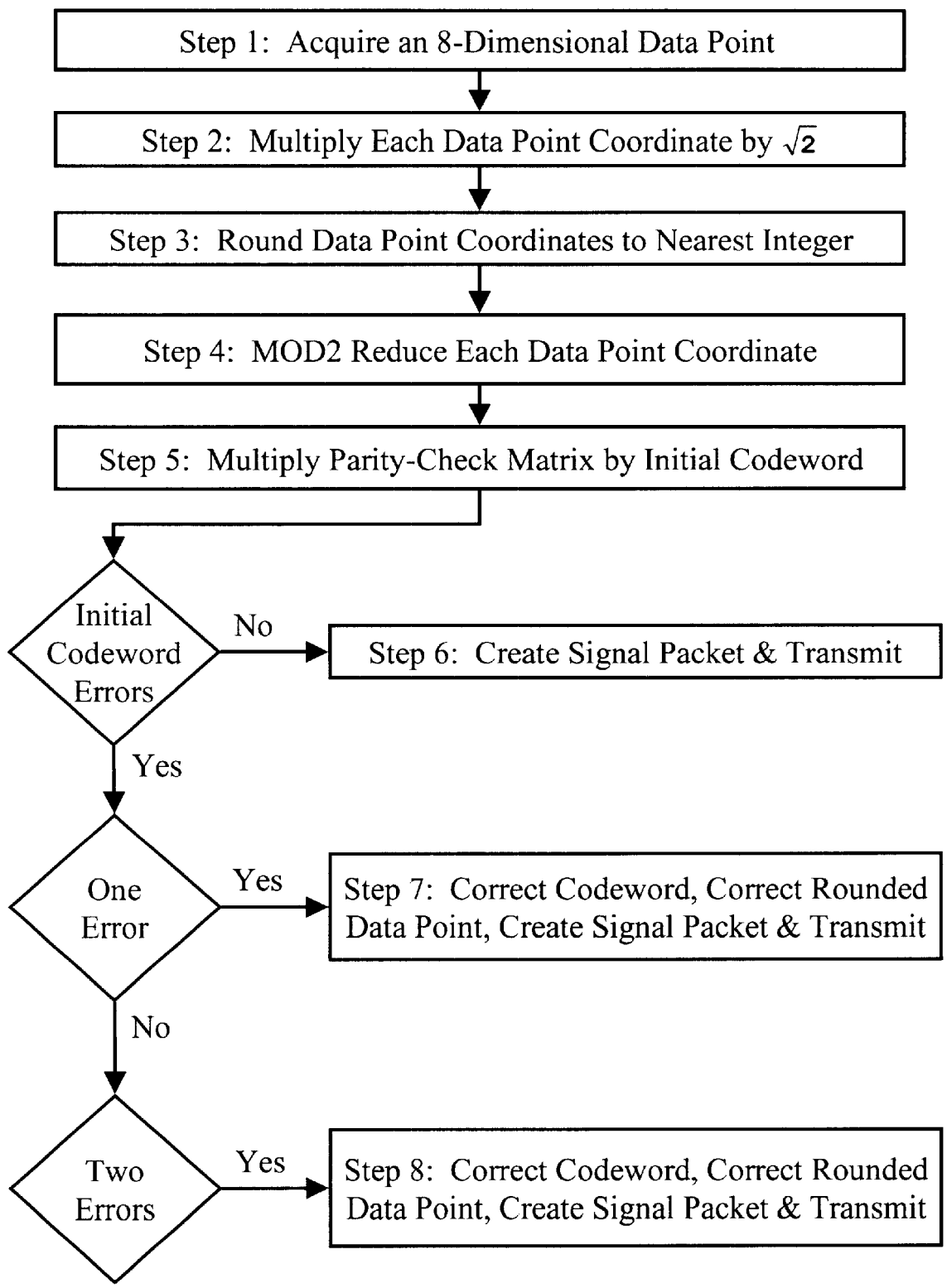
FIG. 1 is a list of steps for quantizing a data point prior to transmission according to a method of the present invention.

The present invention is a method of lattice quantizing an eight-bit data point so that storage requirements and computational complexity are minimized. The present invention improves upon the method of U.S. Pat. No. 5,150,209. In U.S. Pat. No. 5,150,209, 2400 lattice points that do not round to the origin point (i.e., 240 points in shell 1 and 2160 points in shell 2) are represented by 920 points which must be stored. This is a reduction of about 61% over having to store 2400 points. The present invention uses a different, but equivalent, lattice than the one used in U.S. Pat. No. 5,150,209. The lattice used in the present invention has the same number of points in shell 1 and shell 2 as the lattice used in U.S. Pat. No. 5,150,209.

Two alternative methods of identifying a codeword representing the inflated lattice point are presented: the Extended Hamming Code form and the extended quadratic residue code form. In the Extended Hamming Code form storage of a table of sixteen codewords, a table for determining the positions of two 2s in an eight-bit data point, a parity-check matrix, the square root of two, and the reciprocal of the square root of two is required. The storage of sixteen codewords represents an improvement of about 98% over the codeword storage requirement of U.S. Pat. No. 5,150,209. Also, the computations required by U.S. Pat. No. 5,150,209 are more complex than those required by the Extended Hamming Code form of the present invention which only requires multiplication by $\sqrt{2}$ to form an inflated data point at the transmitter and a matrix multiplication at the transmitter. Multiplication by $1/\sqrt{2}$ at the transmitter may be simulated by replacing each plus or minus 1 by $1/\sqrt{2}$ of the same polarity and replacing each plus or minus 2 by $\sqrt{2}$ of the same polarity. In the extended quadratic residue code form of the present invention the storage requirement is reduced from sixteen codewords to one codeword but a transform of coordinates is required.

FIG. 1 lists the steps for lattice-quantizing an eight-bit data point for transmission. The first step 1 is to acquire an eight dimensional data point $x=(x_1, x_2, x_3, x_4, x_5, x_6, x_7, x_8)$, where each value (e.g., $x_1$) is a coordinate of the data point. The lattice used in the present invention is one where multiplying each coordinate of the data point by $\sqrt{2}$ (i.e., inflating the data point) and then reducing each coordinate of the inflated data point modulo-two results in a codeword in the eight-bit Extended Hamming Code. There are sixteen codewords in the eight-bit Extended Hamming Code, and these codewords must be stored at the transmitter and the receiver. The present invention can detect and correct both single-bit errors and double-bit errors. This is an improvement over the method of the Extended Hamming Code which detects and corrects single-bit error but can only detect, but not correct, double bit errors. The lattice used in the present invention is a rotation of the lattice used in U.S. Pat. No. 5,150,209. Symmetries in the rotated lattice are exploited in order to reduce the number of codewords that must be stored as compared to U.S. Pat. No. 5,150,209.

The second step 2 is to multiply each coordinate of the data point by $\sqrt{2}$ to form an inflated data point $y=(y_1, y_2, y_3, y_4, y_5, y_6, y_7, y_8)$. That is, $y_1=(x_1\sqrt{2})$, $y_2=(x_2\sqrt{2})$, ..., and $y_8=(x_8\sqrt{2})$.

The third step 3 is to round each coordinate of the inflated data point to the nearest integer to form a rounded and inflated data point $yr=(yr_1, yr_2, yr_3, yr_4, yr_5, yr_6, yr_7, yr_8)$. For example, if $x_1=1.0$ then $y_1=1.0\sqrt{2}=1.414$, and $y_1$ would be rounded to form $yr_1=1.0$.

The fourth step 4 is to reduce by modulo-two the absolute value of each coordinate of the rounded and inflated data point yr to form an initial determination of the most appropriate code-word $cw_{init}$ to represent the rounded and inflated data point on which it is based. For example, if $yr=(0, -2, 1, 1, 0, 0, 0, 0)$, then $cw_{init}=(0, 0, 1, 1, 0, 0, 0, 0)$.

The fifth step 5 is to multiply a parity-check matrix of the eight-bit Extended Hamming Code by $cw_{init}$, where $cw_{init}$ is represented as a column matrix. The parity-check matrix must be stored by the transmitter and is as follows:

11111111
00011110
01100110
10101010.

If $cw_{init}=(0, 0, 1, 1, 0, 0, 0, 0)$ then the result of the fifth step 5 is as follows:

$$\begin{bmatrix} 11111111 \\ 00011110 \\ 01100110 \\ 10101010 \end{bmatrix} \times \begin{bmatrix} 0 \\ 0 \\ 1 \\ 1 \\ 0 \\ 0 \\ 0 \\ 0 \end{bmatrix} = \begin{matrix} 0+0+1+1+0+0+0+0 \\ 0+0+0+1+0+0+0+0 \\ 0+0+1+0+0+0+0+0 \\ 0+0+1+0+0+0+0+0 \end{matrix} = \begin{matrix} 0 \\ 1 \\ 1 \\ 1 \end{matrix}$$

The result of multiplying the above parity-check matrix by $cw_{init}$, where $cw_{init}$ is represented as a column matrix, is a four bit word, or syndrome, (for example "0, 1, 1, 1," above), that is used to determine whether or not $cw_{init}$ is error free, contains one bit that is in error, or contains two bits that are in error. Since the rounded and inflated data point is the basis for $cw_{init}$, whichever positions are in error in $cw_{init}$ are also in error in the rounded and inflated data point. The rounded and inflated data must be corrected in order to determine the inflated lattice point closest to the inflated version of the acquired data point. $cw_{init}$ must be corrected in order to find the codeword in the eight-bit Extended Hamming Code that must be represented and transmitted to a receiver.

If each of the four bits resulting from the fifth step 5 is a zero then $cw_{init}$ is error free and is equal to one of the sixteen codewords in the eight-bit Extended Hamming Code. $cw_{init}$ may then be transmitted, in an efficient form that will be described below, to a receiver along with information that allows a receiver to modify the codeword in order to recover the rounded and inflated data point. From the recovered rounded and inflated data point, the receiver will recover the intended data point. If $cw_{init}$ is to be transmitted to the receiver then the next step 6 in the method is to prepare $cw_{init}$ and the additional information for transmission. The steps for preparing $cw_{init}$ and the additional information for transmission are described below and are listed in FIGS. 2–6.

If the top-most bit of the four bits resulting from the fifth step 5 in FIG. 1 is a 1 then one of the binary bits of $cw_{init}$ is wrong. Since $cw_{init}$ is based on the rounded and inflated data point, any bit in $cw_{init}$ that is wrong is also wrong in the rounded and inflated data point. The binary number formed by the bottom-three bits of the result of the fifth step 5, where the bottom-most bit is the least significant bit, indicates which bit position is wrong in both $cw_{init}$ and the rounded and inflated data point. The one exception to this rule is when the top-most bit is a 1 and the other three bits are each 0. In this case, the eighth bit position of $cw_{init}$ is wrong. To correct the error in $cw_{init}$, which results in changing $cw_{init}$ to one of the sixteen codewords in the eight-bit Extended Hamming Code, the bit position of $cw_{init}$ that is wrong is flipped. That is, if the bit position that is wrong is a 1 then it is changed to a 0. If the bit position that is wrong is a 0 then it is changed to a 1. To correct the error bit in the rounded and inflated data point, round the basis for the error bit the opposite way from how it was rounded to get the original rounded and inflated data point. For example, if the error bit in the rounded and inflated data point is 1.0 and its was based on an inflated data point of 1.3 then 1.3 would be rounded the opposite way (i.e., to 2) to correct that bit. The corrected rounded and inflated data point would then be used to determine what additional information must be transmitted so that the receiver may modify the correct codeword to recover the correct rounded and inflated data point. The corrected codeword may then be transmitted, in an efficient manner, to the receiver along with additional information that would enable the receiver to reconstruct the correct rounded and inflated data point from the codeword. If one bit in $cw_{init}$ is wrong then the next step 7 in the method is to find the error in $cw_{init}$ and the rounded and inflated data point as described above, correct the error in $cw_{init}$ and the rounded and inflated data point, and prepare the corrected codeword and the additional information for transmission to the receiver. The steps for preparing the corrected codeword and the additional information for transmission are described below and are listed in FIGS. 2–6.

If the top-most bit of the four bits resulting from the fifth step 5 is a zero and at least one of the other three bits is a 1 then two of the bits in $cw_{init}$ are wrong. Again, whichever bits are wrong in $cw_{init}$ are also wrong in the rounded and inflated data point. The bottom three bits, interpreted as a binary number, where the bottom-most bit is the least significant bit, provides information for determining which two bits in $cw_{init}$ and the inflated and rounded data point are wrong. Correcting a two-bit error is one of the unique aspects of the present invention.

If the columns of the parity-check matrix of the eight-bit Extended Hamming Code are summed two at a time, then there will be twenty-eight pairs of columns to sum. That is, eight things taken two at a time results in twenty-eight pairs as follows:

(8, 2)=8!/((8–2)!×2!)=28.

Each column in the parity-check matrix is made up of four binary bits. Summing two columns is equivalent to doing a bit-wise modulo-2 addition on corresponding bits in the two columns. For example, a column consisting of "1010" summed with a column consisting of "1100" results in binary bits "0110," or the decimal number 6. Four pairs of columns sum to decimal number 1, four pairs of columns sum to decimal number 2, and so on through four pairs of columns sum to decimal number 7. The pairs of columns that sum to decimal number 1 are (1, 8), (2, 3), (4, 5) and (6, 7), where the numbers in the parenthesis represent the position of two columns in the parity-check matrix described above, where column numbering starts at the left-most column which is column number one and proceeds linearly to the right-most column which is column number 8. The pairs of columns that sum to decimal number:

2 are (2, 8), (1, 3), (4, 6), and (5, 7);
3 are (3, 8), (1, 2), (4, 7), and (5, 6);
4 are (4, 8), (1, 5), (2, 6), and (3, 7);
5 are (5, 8), (1, 4), (2, 7), and (3, 6);
6 are (6, 8), (1, 7), (2, 4), and (3, 5); and
7 are (7, 8), (1, 6), (2, 5), and (3, 4).

We are not interested in the columns that sum to decimal number 8 (i.e., binary 1000 as described above) since the sum of 8 (i.e., the top-most bit is 1 and the bottom-three bits are each 0) indicates that one error occurred but not two errors. One-bit errors were already addressed above, and the present description concerns correcting two-bit errors.

The column positions in a particular pair of columns that sum to the non-zero three bottom-most bits of the result of the fifth step 5, when the top-most bit is a zero, equate to the two bit positions in $cw_{init}$ that are wrong. Since $cw_{init}$ is based on the rounded and inflated data point, these same two positions are also wrong in the rounded and inflated data point. Therefore, the column-position pairs may be viewed as bit-position pairs. But there are four pairs of columns that sum to each non-zero value of the three bottom-most bits. The question is: Which one pair of these four pairs represents the two bit positions in $cw_{init}$ and the rounded and inflated data point that are wrong?

If the four-bit result of the fifth step 5 includes at least one 1 and the top-most bit is a 0 then find the difference $y_{diff}$=yr–y between the coordinates of the rounded and inflated data point yr and the inflated data point y. For example, if yr=(0, –2, 1, 1, 0, 0, 0, 0) and y=(0.42, –1.71, 1.27, 1.13, 0.0, 0.14, 0.0, 0.0) then $y_{diff}$=(–0.42, –0.3, –0.27, –0.13, 0.0, 0.14, 0.0, 0.0).

Next, for each column-position pair that sums to the number represented by the bottom-three bits of the result of the fifth step 5 (i.e., four pairs), add the absolute value of the two coordinates of $y_{diff}$ that correspond to the values contained in the column-position pair. In the example above, the four column-position pairs that add to 7 are (7, 8), (1, 6), (2, 5), and (3, 4). Therefore, four sums will be generated in this step. The first sum is the sum of the absolute values of coordinates 7 and 8 of $y_{diff}$ (e.g., 0.0+0.0=0.0). The second sum is the sum of the absolute values of coordinates 1 and 6 of $y_{diff}$ (e.g., 0.42+0.14=0.56). The third sum is the sum of the absolutes value of coordinates 2 and 5 of $y_{diff}$ (e.g., 0.3+0.0=0.3). The fourth sum is the sum of the absolute values of coordinates 3 and 4 of $y_{diff}$ (e.g., 0.27+0.13=0.40).

Next, flip those bits in $cw_{init}$ that correspond to the bit-positions represented by the column-position pair that generated the largest sum in the last step. In the example above, column position pair (1, 6) generated the largest sum in the last step (i.e., 0.56). Since column position relates to bit position in $cw_{init}$, flip the first and sixth bit in $cw_{init}$ to correct the two bits that were wrong. In the example above, $cw_{init}$ is changed from (0, 0, 1, 1, 0, 0, 0, 0) to (1, 0, 1, 1, 0, 1, 0, 0). The bit positions that were in error in $cw_{init}$ must also be corrected in the rounded and inflated data point. The procedure described above for correcting a single bit error in the rounded and inflated data point is used to correct each of the two error bits. That is, each bit in the rounded and inflated data point that formed the basis for an erroneous bit is rounded the opposite way from how it was rounded originally. In the present example, the first and sixth bits (i.e., 0 and 0) in the rounded and inflated data point are wrong. In the present example, these originally rounded values were based on 0.42 and 0.14, respectively, which rounded to 0 and 0, respectively. To the correct these two bits, they should be rounded the opposite way to 1.0 and 1.0, respectively. Therefore, the corrected rounded and inflated data point changes from (0, –2, 1, 1, 0, 0, 0, 0) to (1, –2, 1, 1, 0, 1, 0, 0).

The corrected codeword (e.g., (1, 0, 1, 1, 0, 1, 0, 0), which now matches one of the sixteen codewords in the eight-bit Extended Hamming Code, is then transmitted, in an efficient manner, to the receiver along with additional information that enables the receiver to recover the intended codeword, reconstruct the intended rounded and inflated data point (e.g., (1, –2, 1, 1, 0, 1, 0, 0) from the codeword, and recover the intended data point from the recovered rounded and inflated data point. If two bits in $cw_{init}$ are wrong then the next step 8 in the method is to find the two errors as described above, correct the errors in both $cw_{init}$ and the rounded and inflated data point, and prepare the corrected codeword and the additional information for transmission to the receiver. The steps for preparing the corrected codeword and the additional information for transmission are described below and are listed in FIGS. 2–6.

The lattice of the present invention is based on the eight-bit Extended Hamming Code. The sixteen eight-bit codewords contained in the eight-bit Extended HI-laming Code are as follows:

0. (0, 0, 0, 0, 0, 0, 0, 0);
1. (0, 0, 0, 1, 1, 1, 1, 0);

2. (0, 0, 1, 0, 1, 1, 0, 1);
3. (0, 0, 1, 1, 0, 0, 1, 1);
4. (0, 1, 0, 0, 1, 0, 1, 1);
5. (0, 1, 0, 1, 0, 1, 0, 1);
6. (0, 1, 1, 0, 0, 1, 1, 0);
7. (0, 1, 1, 1, 1, 0, 0, 0);
8. (1, 0, 0, 0, 0, 1, 1, 1);
9. (1, 0, 0, 1, 1, 0, 0, 1);
10. (1, 0, 1, 0, 1, 0, 1, 0);
11. (1, 0, 1, 1, 0, 1, 0, 0);
12. (1, 1, 0, 0, 1, 1, 0, 0);
13. (1, 1, 0, 1, 0, 0, 1, 0);
14. (1, 1, 1, 0, 0, 0, 0, 1); and
15. (1, 1, 1, 1, 1, 1, 1, 1).

Position numbers are given to each codeword in the Extended Hamming Code form of the present invention because it takes fewer bits to transmit the position of a codeword (i.e., four bits) than it does to transmit an eight-bit codeword (i.e., eight bits) using the Extended Hamming Code form of the invention. The position numbers are used in the steps of FIGS. 2 through 6 to efficiently represent a codeword to be transmitted. Note that the eight-bit Extended Hamming Code contains an all-0s codeword, an all-1s codeword, and fourteen codewords that have weight four (i.e., codewords that contain four ones).

In the alternate extended quadratic residue code form of the present invention an extended quadratic residue code equivalent to the sixteen eight-bit codewords contained in the eight-bit Extended Hamming Code can be obtained by transforming coordinates. In transforming the coordinates of the Extended Hamming Code to obtain the extended quadratic residue code, the all-0s and all-1s codewords remain the same. The weight-four codewords can be transformed as follows.

Let $x=(x_1, x_2, x_3, x_4, x_5, x_6, x_7, x_8)$ be a weight-four codeword of the eight-bit Extended Hamming Code.

If $x_1=0$, replace $x=(x_1, x_2, x_3, x_4, x_5, x_6, x_7, x_8)$ with $y=(y_1, y_2, y_3, y_4, y_5, y_6, y_7, y_8)$, the extended quadratic residue code, where:

$y_1=\frac{1}{2}(-x_2+x_4+x_6+x_8)$;

$y_2=\frac{1}{2}(x_3-x_4+x_7+x_8)$;

$y_3=\frac{1}{2}(x_2+x_4-x_6+x_8)$;

$y_4=\frac{1}{2}(x_2-x_3+x_6+x_7)$;

$y_5=\frac{1}{2}(x_2+x_3+x_6-x_7)$;

$y_6=\frac{1}{2}(x_3+x_4+x_7-x_8)$;

$y_7=x_5$; and $y_8=0$.

If $x_1=1$, complement the weight-four codeword of the eight-bit Extended Hamming Code and then transform as above.

The sixteen eight-bit extended quadratic residue codeword thus obtained are:

0. (0, 0, 0, 0, 0, 0, 0, 0);
1. (1, 0, 0, 1, 0, 1, 1, 0);
2. (1, 1, 0, 0, 1, 0, 1, 0);
3. (1, 1, 1, 0, 0, 1, 0, 0);
4. (0, 1, 1, 1, 0, 0, 1, 0);
5. (1, 0, 1, 1, 1, 0, 0, 0);
6. (0, 1, 0, 1, 1, 1, 0, 0);
7. (0, 0, 1, 0, 1, 1, 1, 0);
8. (0, 1, 1, 0, 1, 0, 0, 1);
9. (0, 0, 1, 1, 0, 1, 0, 1);
10. (0, 0, 0, 1, 1, 0, 1, 1);
11. (1, 0, 0, 0, 1, 1, 0, 1);
12. (0, 1, 0, 0, 0, 1, 1, 1);
13. (1, 0, 1, 0, 0, 0, 1, 1);
14. (1, 1, 0, 1, 0, 0, 0, 1); and
15. (1, 1, 1, 1, 1, 1, 1, 1).

The fourteen eight-bit weight-four extended quadratic residue codewords have the property that any one of them can be obtained from any other by circularly shifting the first seven bits of the codeword, leaving the last bit fixed, or taking the complement of such a shift. This allows the transmitter and receiver to store only one weight-four extended quadratic residue codeword versus fourteen Extended Hamming Code codewords. It will be appreciated that other extended quadratic residue codes can be generated where any eight-bit weight-four codeword can be obtained from any other through circular shifting and complementing while leaving any one of the bits positions fixed.

For example, using the extended quadratic residue codewords above and storing codeword 1, right circular shifting of the first seven bits once results in codeword 2, two shifts in codeword 3, through 6 shifts for codeword 7. Codewords 8 through 14 are the complements of codewords 1 through 7. Again, for this example we have used right circular shifts. Left circular shifts would work as well. (Note that the direction of the shift is unimportant, i.e. 7 right shifts=1 left shift. The opposite shift direction chosen for transmission is used for reception.) Hereinafter left circular shifting will be shown for transmission examples and right circular shifting for reception examples.

Figure 12:
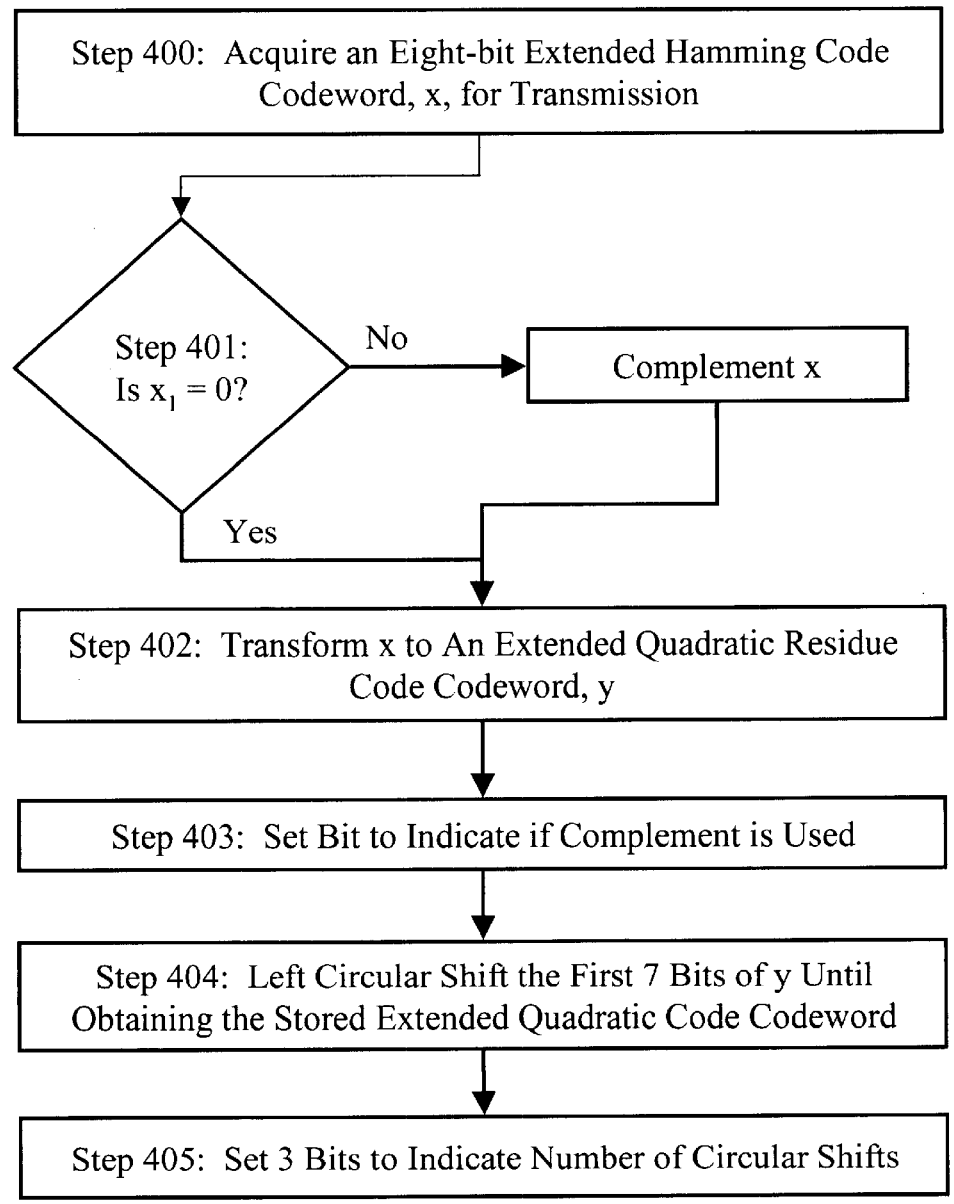
FIG. 12 is a list of steps for encoding an Extended Hamming Codeword using an extended quadratic residue code according to a method of the present invention.
Figure 13:
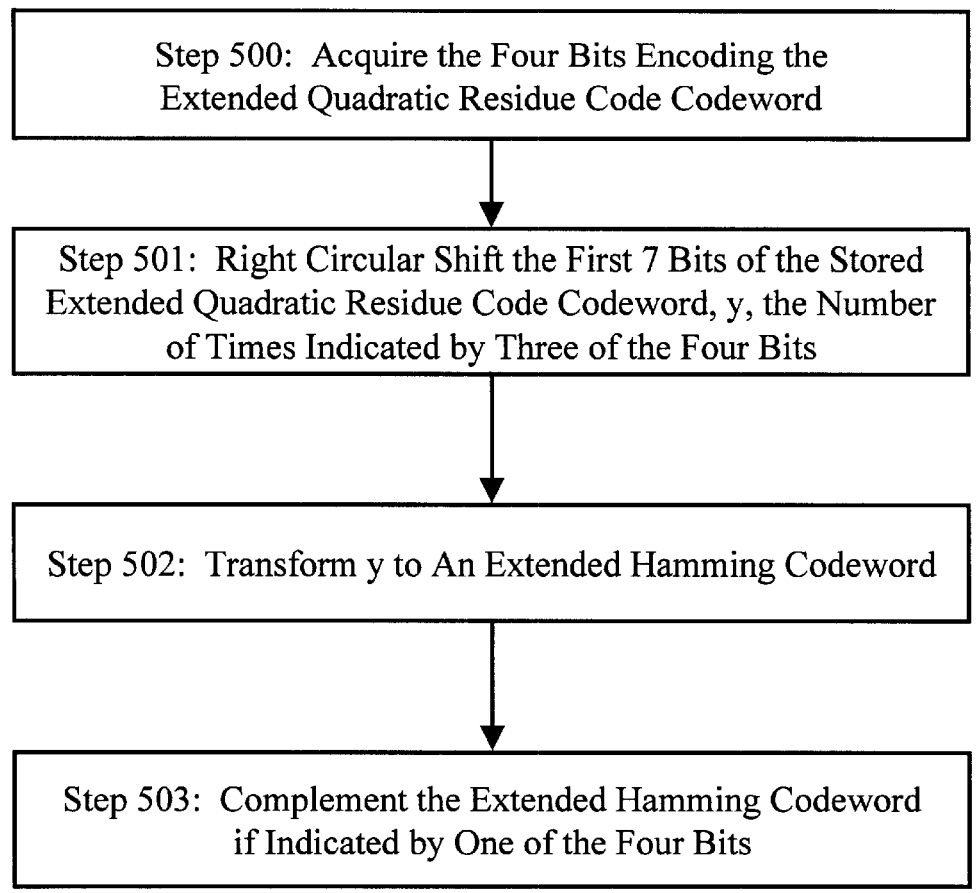
FIG. 13 is a list of steps for decoding an Extended Hamming Codeword from an extended quadratic residue code according to a method of the present invention.

As shown in FIGS. 12 and 13, to transmit and receive the proper initial codeword of the Extended Hamming Code in the alternate extended quadratic residue code mode of the present invention, the codeword is first acquired (step 400), and then complemented if $x_1=1$ (Step 401). The codeword or complemented codeword is then transformed into an extended quadratic residue codeword (step 402). For the weight-four codewords one bit is then used to indicate if we used the acquired codeword or its complement (step 403). The first 7 bits of the extended quadratic residue codeword are then left circular shifted until the stored codeword is obtained (step 404). Three 3 bits are used to indicate how many times (0 through 6) we left circular shift with the last bit fixed to obtain the stored codeword (step 405). As three bits, capable of indicating eight binary numbers (0 through 7), are used to indicate only seven shift possibilities (0 through 6), one additional situation can be indicated by the three bits. For example, using the one bit to indicate if the codeword or its complement are used and binary seven to indicate the additional possibility provides "0111" and "1111," which can be used to encode the all-0s and all-1s extended quadratic residue code codewords.

At the receiver, the Extended Hamming Code can be regenerated through a transform of the coordinates of the extended quadratic residue code. The all-0s and all-1s codewords remain the same. The weight-four codewords can be transformed as follows.

Let y ($y_1, y_2, y_3, y_4, y_5, y_6, y_7, y_8$) be the weight-four codeword of the eight-bit extend quadratic residue code stored by the receiver.

First, acquire the code encoding the extended quadratic residue code codeword from which the Extended Hamming Code codeword may be obtained (step 500).

The first 7 bits of the codeword stored by the receiver are then right circularly shifted the number of times indicated by the 3 bits encoded with the transmitted circular shift information (step 501).

In the next step, step 502, y, where y=($y_1$, $y_2$, $y_3$, $y_4$, $y_5$, $y_6$, $y_7$, $y_8$), the extended quadratic residue codeword stored by the receiver and circularly shifted in step 501, is replaced with x=($x_1$, $x_2$, $x_3$, $x_4$, $x_5$, $x_6$, $x_7$, $x_8$), the Extended Hamming Code, where:

$x_1$=0;
$x_2$=½($-y_1+y_3+y_4+y_5$);
$x_3$=½($y_2-y_4+y_5+y_6$);
$x_4$=½($y_1-y_2+y_3+y_6$);
$x_5$=$y_7$;
$x_6$=½($y_1-y_3+y_4+y_5$);
$x_7$=½($y_2+y_4-y_5+y_6$); and
$x_8$=½($y_1+y_2+y_3-y_6$).

The resulting Extended Hamming Code is then complemented if indicated by the 1 bit complement information (step 503).

As an example if the extended quadratic residue code codeword stored by the transmitter and receiver is (0, 1, 1, 1, 0, 0, 1, 0) (number 4 on the extended quadratic residue code codeword list above) and Extended Hamming Code codeword (1,1,0,1,0,0,1,0) (number 13 on the Extended Hamming Code codeword list above) is to be transmitted, the Extended Hamming Code codeword, x, would be complemented because $x_1$=1. Thus x=(0, 0, 1, 0, 1, 1, 0, 1). Transforming:

$$y_1 = \frac{1}{2}(-x_2 + x_4 + x_6 + x_8) = 1;$$

$$y_2 = \frac{1}{2}(x_3 - x_4 + x_7 + x_8) = 1;$$

$$y_3 = \frac{1}{2}(x_2 + x_4 - x_6 + x_8) = 0;$$

$$y_4 = \frac{1}{2}(x_2 - x_3 + x_6 + x_7) = 0;$$

$$y_5 = \frac{1}{2}(x_2 + x_3 + x_6 - x_7) = 1;$$

$$y_6 = \frac{1}{2}(x_3 + x_4 + x_7 - x_8) = 0;$$

$$y_7 = x_5 = 1; \text{ and}$$

$$y_8 = 0. \text{ So}$$

y=(1, 1, 0, 0, 1, 0, 1, 0).

Five left circular shifts of the first 7 bits of this codeword are require to get the stored codeword (0, 1, 1, 1, 0, 0, 1, 0). So, one bit is transmitted to indicate that the complement was used and three bits are used to indicate that 5 left circular shifts were required (e.g. 1 101).

At the receiver the first 7 bits of the stored extended quadratic residue code codeword are right circularly shifted 5 times to obtain y=(1, 1, 0, 0, 1, 0, 1, 0). Transforming:

$$x_1 = 0;$$

$$x_2 = \frac{1}{2}(-y_1 + y_3 + y_4 + y_5) = 0;$$

$$x_3 = \frac{1}{2}(y_2 - y_4 + y_5 + y_6) = 1;$$

$$x_4 = \frac{1}{2}(y_1 - y_2 + y_3 + y_6) = 0;$$

-continued $$x_5 = y_7 = 1;$$

$$x_6 = \frac{1}{2}(y_1 - y_3 + y_4 + y_5) = 1;$$

$$x_7 = \frac{1}{2}(y_2 + y_4 - y_5 + y_6) = 0; \text{ and}$$

$$x_8 = \frac{1}{2}(y_1 + y_2 + y_3 - y_6) = 1. \text{ So}$$

x=(0, 0, 1, 0, 1, 1, 0, 1). However, the complement of x was indicated by the transmitter so x is complemented to correctly produce x=(1, 1, 0, 1, 0, 0, 1, 0).

TRANSMISSION OF AN ALL-0s CODEWORD IN SHELL 1

Figure 2:
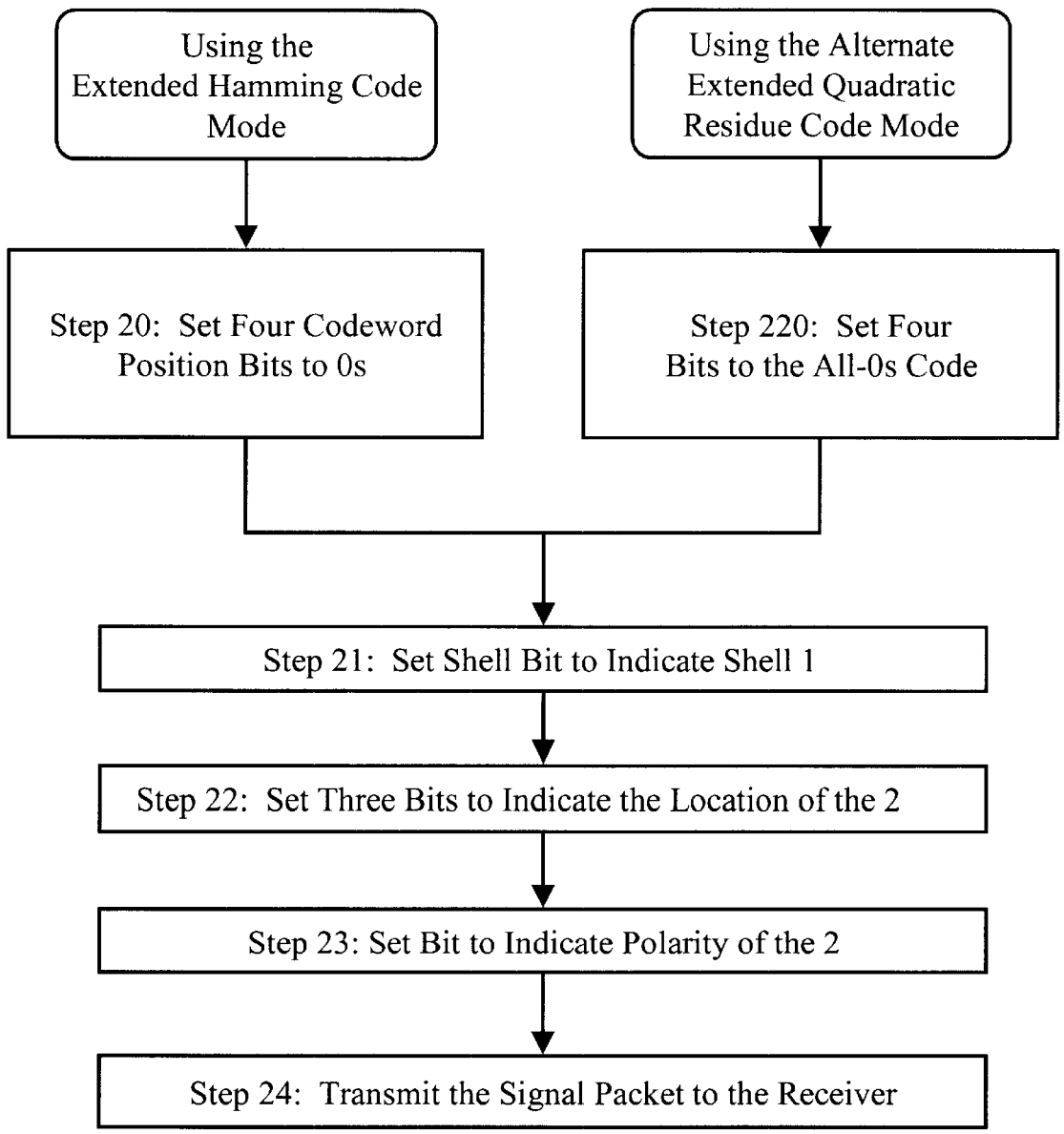
FIG. 2 is a list of steps for transmitting a signal packet for an all-0s codeword in shell 1 according to two methods of the present invention.

FIG. 2 lists the steps for transmitting an all-0s codeword in shell 1 and additional information that enables a receiver to recover the codeword and modify the codeword in order to recover the rounded and inflated data point on which the codeword is based. A rounded and inflated data point in shell 1 is represented by an all-0s codeword consists of seven 0s and one 2 distributed therein.

As mentioned above, the eight-bit codeword need not be transmitted. In the Extended Hamming Code mode of the present invention, only the four-bit binary number that represents the position of the codeword in the list above need be transmitted in order to identify the codeword to the receiver. This requires that both the transmitter and the receiver store the sixteen eight-bit codewords of the Extended Hamming Code using an identical position numbering scheme. Any suitable position numbering scheme that may be represented using four bits may be used. For example, the transmitter need only transmit binary bits "1010" if it wishes to transmit codeword (1, 0, 1, 0, 1, 0, 1, 0) which is at decimal position 10 in the list of codewords above.

In the alternate extended quadratic residue code mode of the present invention the special all-0s code is transmitted (e.g. 0111).

The first step 20 in preparing an all-0s codeword in shell 1 for transmission is to set four bits (e.g., the first four bits. Note that other bit locations may be used to indicate codeword position.) to the position of the all-0s codeword (e.g., all 0s in the codeword list above) in the Extended Hamming Code mode or to the all-0s code (e.g. 0111) in the alternate extended quadratic residue code mode of the present invention (step 220). Additional information must now be added in order to instruct the receiver on how to modify the codeword in order to recover the rounded and inflated data point.

The next step 21 is to set a bit (e.g., the fifth bit) to tell the receiver that the all-0s codeword of shell 1 is in shell 1. The bit may be set to 1 to indicate shell 1, but the inverse may be used.

Since the rounded and inflated data point referred to by an all-0s codeword in shell 1 is eight bits long and contains a 2, three additional bits are needed to tell the receiver the location of the 2. Therefore, the next step 22 is to set three bits (e.g., the sixth bit, the seventh bit, and the eighth bit) to a binary value that indicates which coordinate in the codeword must be changed to a2.

The next step 23 is to set a bit (e.g., the ninth bit) to a value that indicates the polarity of the 2. A "0" bit may indicate +2 and a "1" bit may indicate −2, or it may be the other way around.

The last step 24 of FIG. 2 is to transmit the nine bits described above to a receiver. The receiver will receive the signal packet, recover the intended codeword, and use the additional information to modify the codeword in order to recover the rounded and inflated data point. The inflated data point will then be deflated in order to recover the intended data point. The steps for recovering the intended data point based on an all-0s codeword in shell 1 are described below and listed in FIG. 7.

TRANSMISSION OF AN ALL-0s CODEWORD IN SHELL 2

Figure 3:
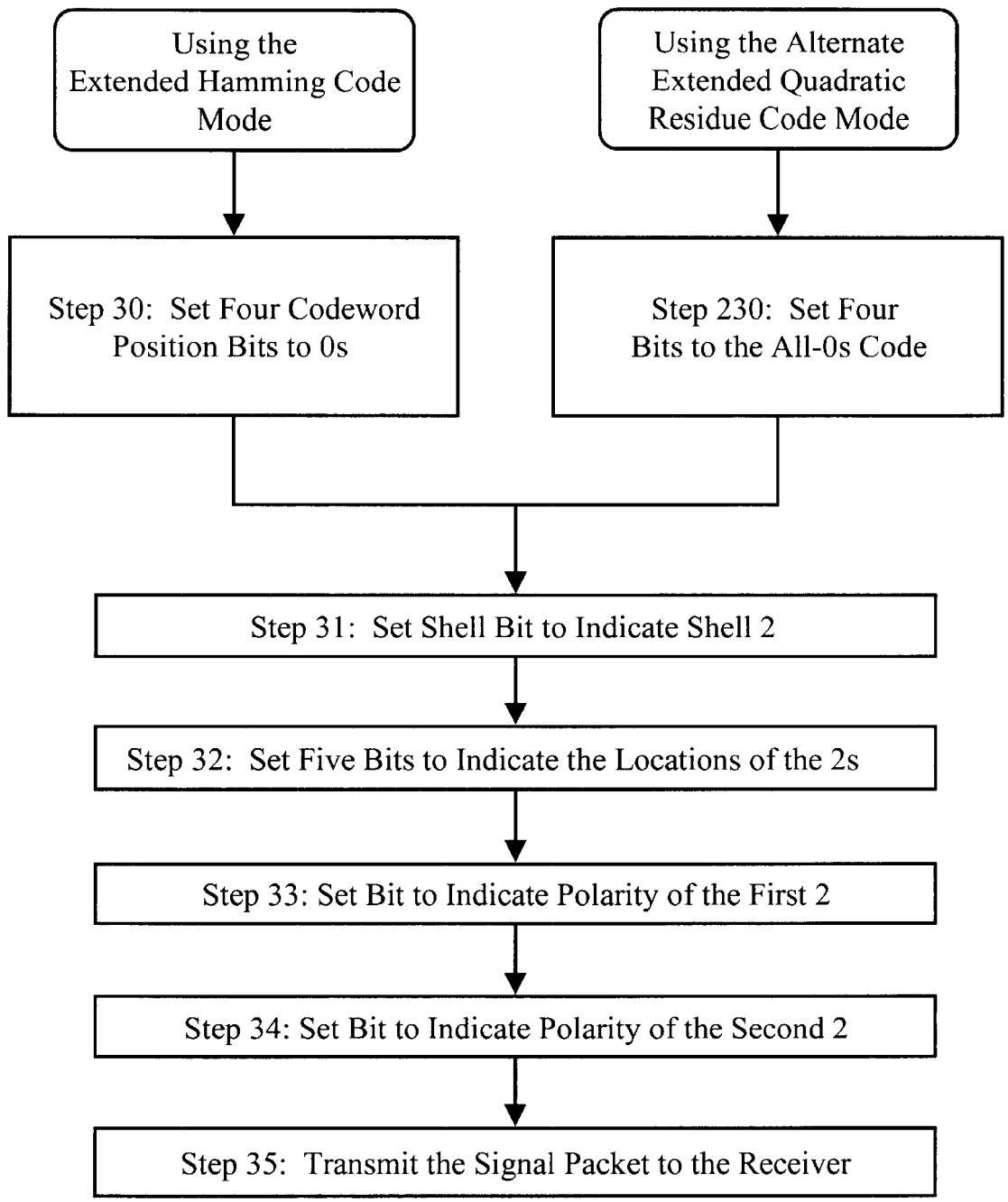
FIG. 3 is a list of steps for transmitting a signal packet for an all-0s codeword in shell 2 according to two methods of the present invention.

FIG. 3 lists the steps for transmitting an all-0s codeword in shell 2 and additional information that enables a receiver to recover the codeword and modify the codeword in order to recover the rounded and inflated data point on which it is based. An all-0s codeword in shell 2 represents a rounded and inflated data point that consists of six 0s and two 2s distributed therein.

The first step 30 is to set four bits (e.g., the first four bits) to the position of the all-0s codeword in the listing of the codewords of the eight-bit Extended Hamming Code (e.g., all 0s) in the Extended Hamming Code mode or to the all-0s code (e.g. 0111) in the alternate extended quadratic residue code mode of the present invention (step 230).

The next step 31 is to set a bit (e.g., the fifth bit) to a value (e.g., 0) that tells the receiver that the all-0s codeword is in shell 2.

There are two 2s in the rounded and inflated data point in shell 2. There are twenty-eight different ways that two 2s may appear in an eight-bit word. Instead of transmitting three bits for each 2 to tell the receiver the location of that 2, it is more efficient to create a table with twenty-eight positions, where each position in the table contains the locations of the two 2s. In an alternate embodiment, an equation may be used to represent a 2s-position table. If an equation is used, a table need not be stored but a calculation must be made in order to determine the position of the two 2s. So, there is a trade-off between storing a table and making a calculation. Storing a 2s-position table is preferred. Only five bits are needed to represent twenty-eight positions. Using a 2s-position look-up table saves one bit. In addition, this requires that both the transmitter and the receiver store the identical 2s-position look-up table. The twenty-eight position pairs may be distributed throughout the table in any suitable manner.

The next step 32 is to set five bits (e.g., the sixth bit, the seventh bit, the eight bit, the ninth bit, and the tenth bit) to a binary number that represents the position in the 2s-position look-up table that contains information that tells the receiver which two coordinates of the recovered codeword must be changed to 2s.

One example of a 2s-position listing that includes a position number and the two coordinate positions that must be changed to 2s for each position is as follows:

0. 1, 2
1. 1, 3
2. 1, 4
3. 1, 5
4. 1, 6
5. 1, 7
6. 1, 8
7. 2, 3
8. 2, 4
9. 2, 5
10. 2, 6
11. 2, 7
12. 2, 8
13. 3, 4
14. 3, 5
15. 3, 6
16. 3, 7
17. 3, 8
18. 4, 5
19. 4, 6
20. 4, 7
21. 4, 8
22. 5, 6
23. 5, 7
24. 5, 8
25. 6, 7
26. 6, 8
27. 7, 8

The next step 33 is to set a bit (e.g., the eleventh bit) to indicate the polarity of the first 2 in the rounded and inflated data point A "0" bit may be used to indicate a positive number and a "1" bit may be used to indicate a negative number, but this may be reversed.

The next step 34 is to set a bit (e.g., the twelfth bit) to indicate the polarity of the second 2 in the rounded and inflated data point.

The last step 35 listed in FIG. 3 is to transmit the twelve bits described above to a receiver.

TRANSMISSION OF AN ALL-1s CODEWORD IN SHELL 2

Figure 4:
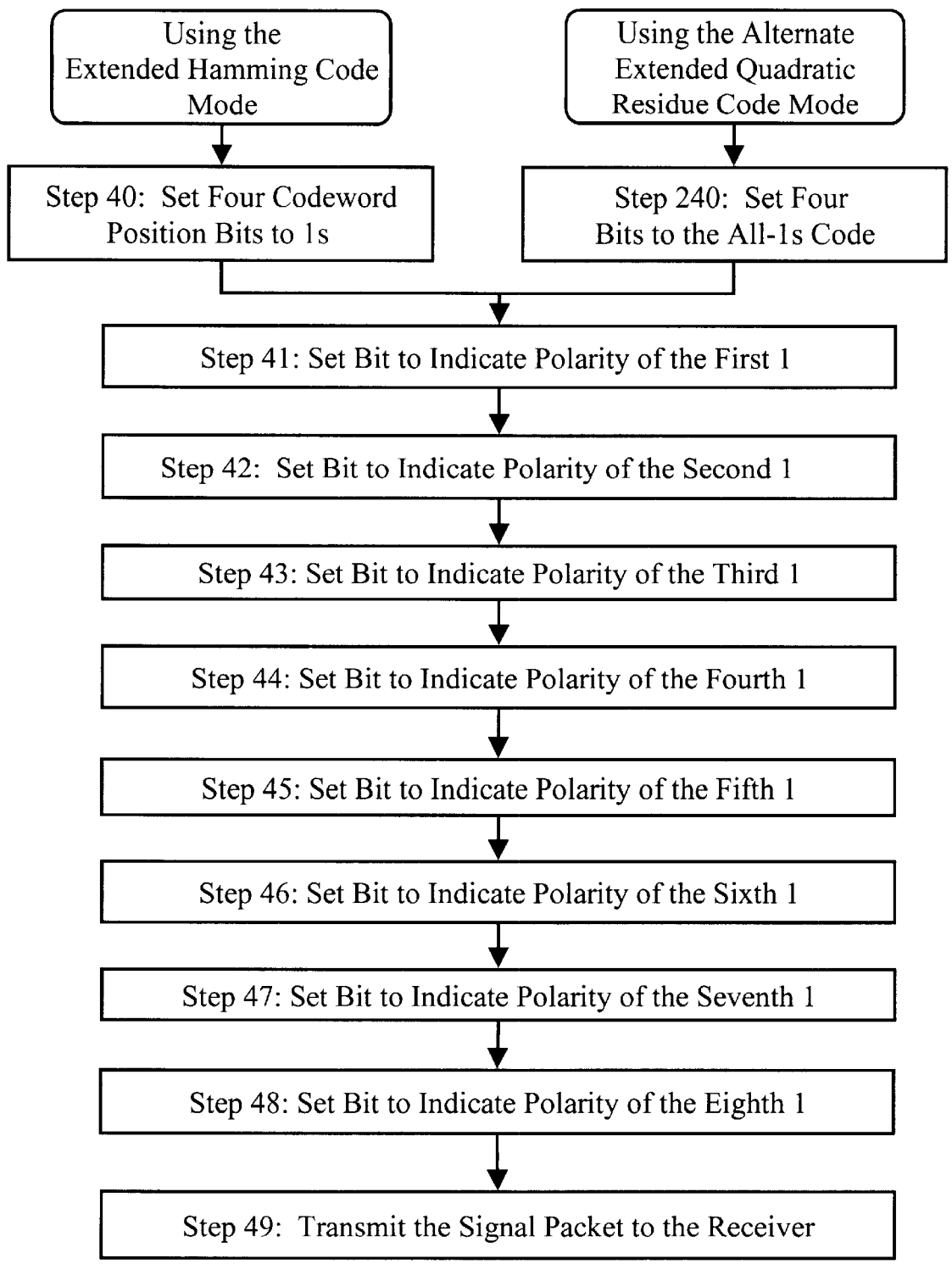
FIG. 4 is a list of steps for transmitting a signal packet for an all-1s codeword in shell 2 according to two methods of the present invention.

FIG. 4 lists the steps for transmitting an all-1s codeword and additional information that enables a receiver to recover the codeword and modify the codeword in order to recover the rounded and inflated data point on which the codeword is based. The rounded and inflated data point that resulted in an all-1s codeword is in shell 2 and is never in shell 1. Therefore, a bit indicating shell need not be transmitted. A rounded and inflated data point based on an all-1s codeword consists of eight 1 s, where each 1 may be either positive or negative.

The first step 40 is to set four bits (e.g., the first four bits) to the position in the table of codewords of the eight-bit Extended Hamming Code where the all-1s codeword (e.g., all 1s) may be found in the Extended Hamming Code mode or to the all-1s code (e.g. 1111) in the alternate extended quadratic residue code mode of the present invention (step 240).

The next step 41 is to set a bit (e.g., the fifth bit) to indicate the polarity of the first 1 in the rounded and inflated data point A "0" may be used to indicate +1, and a "1" may be used to indicate −1, but this may be reversed.

The next step 42 is to set a bit (e.g., the sixth bit) to indicate the polarity of the second 1 in the rounded and inflated data point.

The next step 43 is to set a bit (e.g., the seventh bit) to indicate the polarity of the third 1 in the rounded and inflated data point.

The next step 44 is to set a bit (e.g., the eighth bit) to indicate the polarity of the fourth 1 in the rounded and inflated data point.

The next step 45 is to set a bit (e.g., the ninth bit) to indicate the polarity of the fifth 1 in the rounded and inflated data point.

The next step 46 is to set a bit (e.g., the tenth bit) to indicate the polarity of the sixth 1 in the rounded and inflated data point.

The next step 47 is to set a bit (e.g., the eleventh bit) to indicate the polarity of the seventh 1 in the rounded and inflated data point.

The next step 48 is to set a bit (e.g., the twelfth bit) to indicate the polarity of the eighth 1 in the rounded and inflated data point.

The last step 49 in FIG. 4 is to transmit the twelve bits described above to a receiver.

TRANSMISSION OF A WEIGHT-FOUR CODEWORD IN SHELL 1

Figure 5:
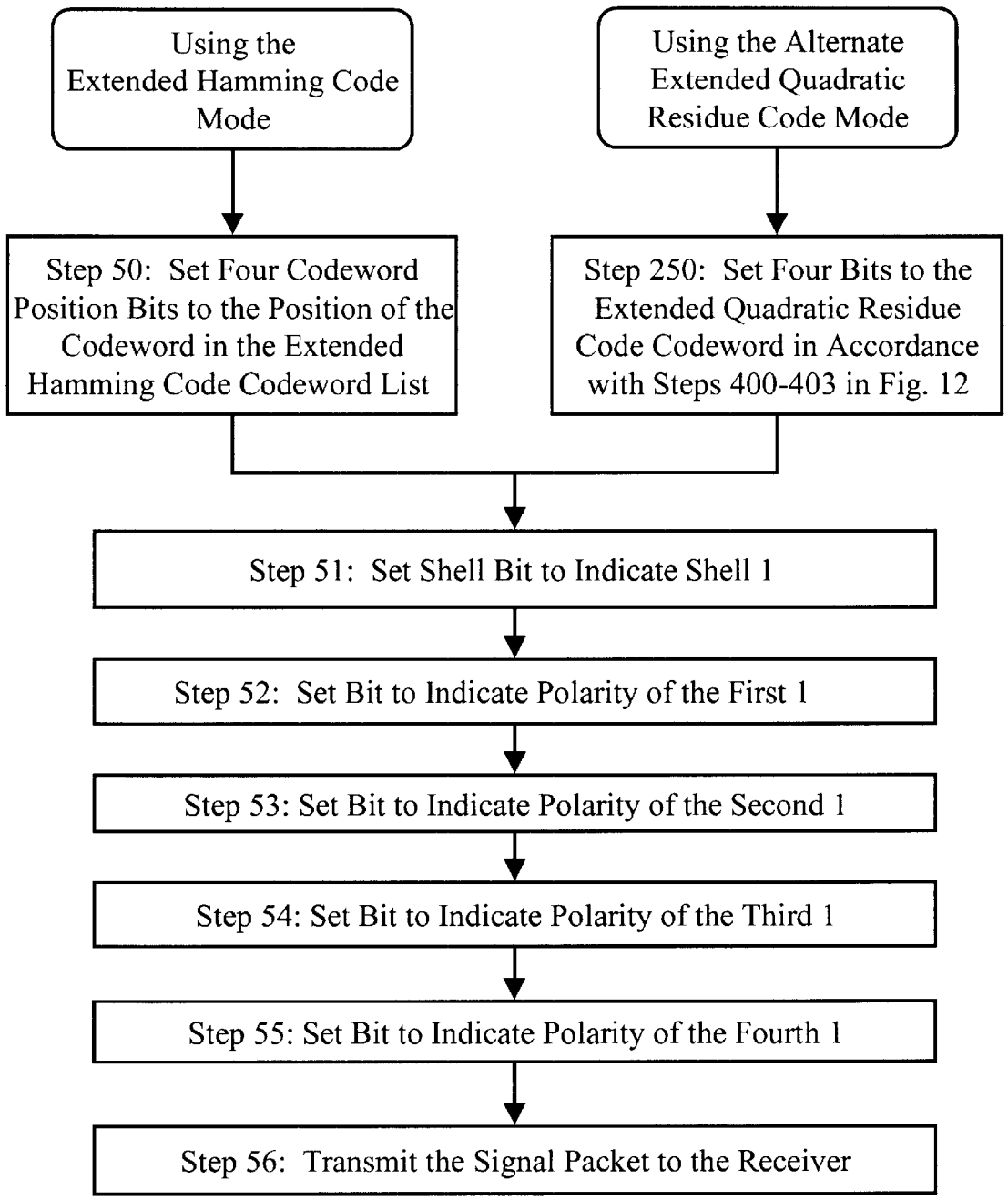
FIG. 5 is a list of steps for transmitting a signal packet for a weight-four codeword in shell 1 according to two methods of the present invention.

FIG. 5 lists the steps for transmitting a codeword of weight four that is in shell 1 and additional information that enables a receiver to recover the codeword and modify the codeword in order to recover the rounded and inflated data point on which the codeword is based A rounded and inflated data point based on a codeword of weight four that is in shell 1 consists of four 1s and four 0s distributed therein Each 1 bit in the rounded and inflated data point may be either positive or negative.

The first step 50 is to set four bits (e.g., the first four bits) to the position of the corresponding codeword of weight four in the list of codewords in the eight-bit Extended Hamming Code in the Extended Hamming Code mode or to the four bit alternate extended quadratic code mode codeword encoding in the alternate extended quadratic residue code mode of the present invention (step 250).

The next step 51 is to set a bit (e.g., the fifth bit) to a value (e.g., 1) to indicate that the codeword is in shell 1.

The next step 52 is to set a bit (e.g., the sixth bit) to indicate the polarity of the first 1 in the rounded and inflated data point A "0" may be used to indicate +1 and a "1" may be used to indicate −1, but this may be reversed.

The next step 53 is to set a bit (e.g., the seventh bit) to indicate the polarity of the second 1 in the rounded and inflated data point.

The next step 54 is to set a bit (e.g., the eighth bit) to indicate the polarity of the third 1 in the rounded and inflated data point.

The next step 55 is to set a bit (e.g., the ninth bit) to indicate the polarity of the fourth 1 in the rounded and inflated data point.

The last step 56 in FIG. 5 is to transmit the nine bits described above to a receiver.

TRANSMISSION OF A WEIGHT-FOUR CODEWORD IN SHELL 2

Figure 6:
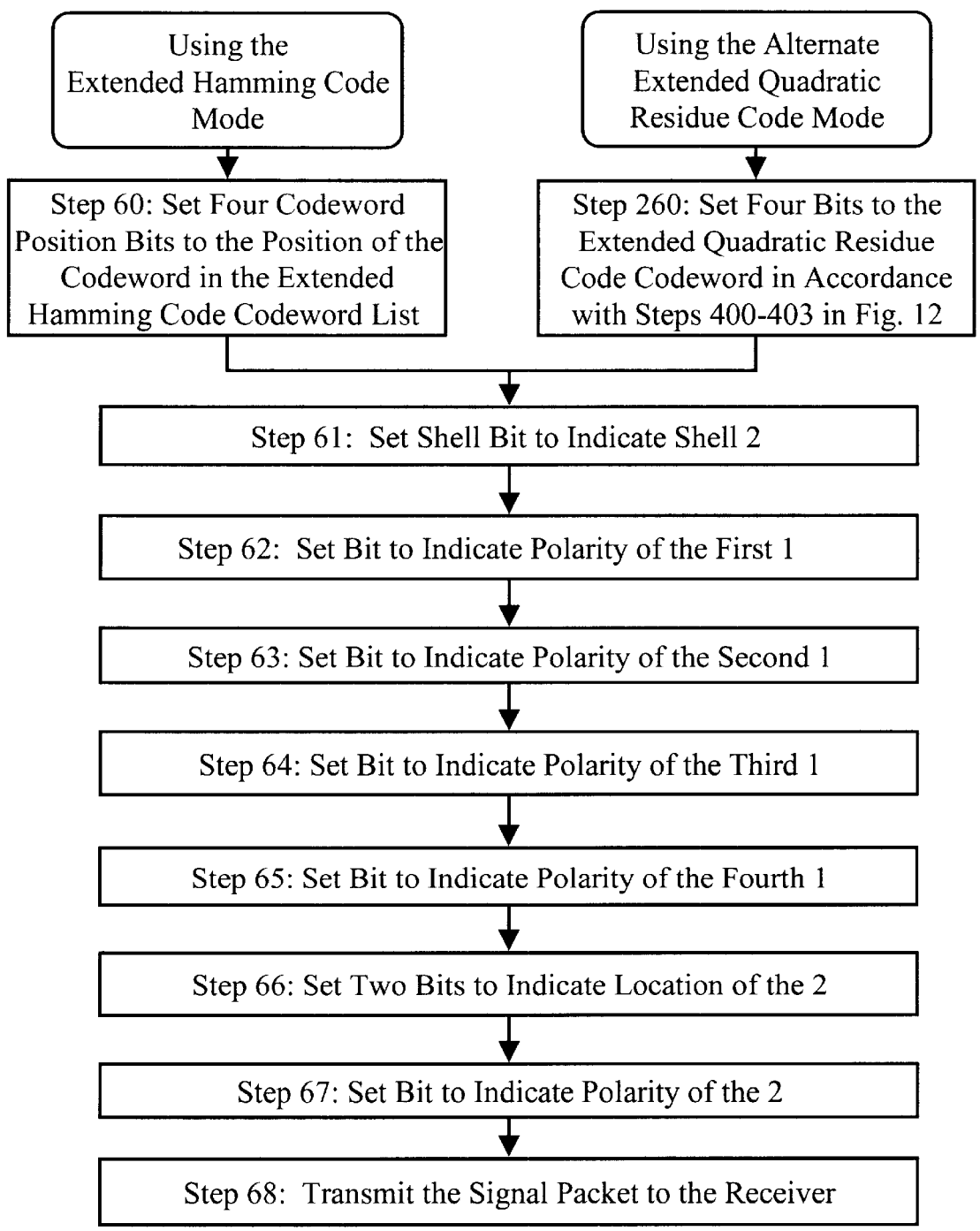
FIG. 6 is a list of steps for transmitting a signal packet for a weight-four codeword in shell 2 according to two methods of the present invention.

FIG. 6 lists the steps for transmitting a codeword of weight four that is in shell 2 and additional information that enables a receiver to recover the codeword and modify it in order to recover the rounded and inflated data point on which it is based A rounded and inflated data point based on a codeword of weight four that is in shell 2 consists of four 1s, a 2, and three 0s distributed therein Each 1-bit and the 2-bit in the rounded and inflated data point may be either positive or negative.

The first step 60 is to set four bits (e g., the first four bits) to the position in the codeword table of the eight-bit Extended Hamming Code where the codeword to be transmitted may be found in the Extended Hamming Code mode or to the four bit alternate extended quadratic code mode codeword encoding in the alternate extended quadratic residue code mode of the present invention (step 260).

The next step 61 is to set a bit (e.g., the fifth bit) to a value (e.g. 0) to indicate that the codeword is in shell 2.

The next step 62 is to set a bit (e.g., the sixth bit) to indicate the polarity of the first 1 in the rounded and inflated data point A "0" bit may be used to indicate a positive number and a "1" bit may be used to indicate a negative number, but this may be reversed.

The next step 63 is to set a bit (e.g., the seventh bit) to indicate the polarity of the second 1 in the rounded and inflated data point.

The next step 64 is to set a bit (e.g., the eighth bit) to indicate the polarity of the third 1 in the rounded and inflated data point.

The next step 65 is to set a bit (e.g., the ninth bit) to indicate the polarity of the fourth 1 in the rounded and inflated data point.

The next step 66 is to set two bits (e.g., the tenth bit and the eleventh bit) to indicate the location of the 2 in the rounded and inflated data point Only two bits are needed for this because the 1s are ignored and the other four positions are thought of as each being 0. The two bits indicate which of the 0s is replaced with a 2 (i.e., the first 0, the second 0, the third 0, or the fourth 0).

The next step 67 is to set a bit (e.g., the twelfth bit) to indicate the polarity of the 2.

The last step 68 in FIG. 5 is to transmit the twelve bits described above to a receiver.

Once a signal packet, in one of the forms described above, is received by a receiver the receiver has to determine which type of codeword is represented by the received packet (i.e., an all-0s codeword in shell 1, an all-0s codeword in shell 2, an all-1s codeword in shell 1, a weight-four codeword in shell 1, or a weight-four codeword in shell 2), reconstruct the codeword, modify it according to the additional information received in order to recover the rounded and inflated data point on which the codeword is based, and recover the data point from the rounded and inflated data point The receiver must store and use the same eight-bit Extended Hamming Code table or extended quadratic residue code codeword that was stored and used by the transmitter. The steps associated with each type of reception are listed below in FIGS. 7 through 11 and 13.

RECEPTION OF AN ALL-0s CODEWORD IN SHELL 1

Figure 7:
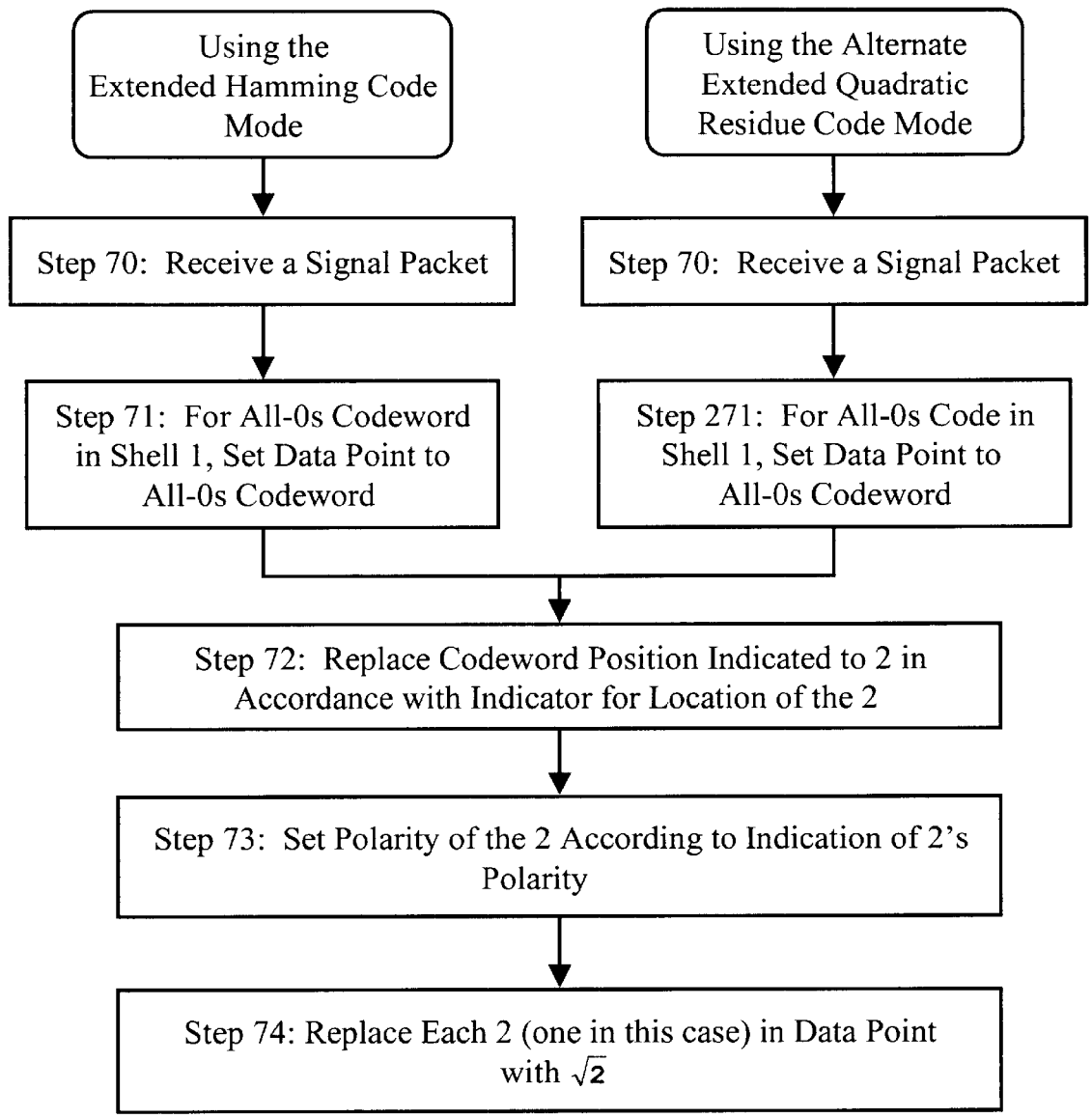
FIG. 7 is a list of steps for decoding a signal packet for an all-0s codeword in shell 1 according to two methods of the present invention.

FIG. 7 lists the steps that a receiver must perform in order to reconstruct a data point from a signal packet containing all-0s codeword in shell 1 and additional information that enables the receiver to recover the rounded and inflated data point on which the codeword is based.

The first step 70 is to receive the signal packet

The next step 71 (step 271 when using the alternate extended quadratic residue code form) is to determine whether or not the first four bits represent the all-0s codeword of the eight-bit Extended Hamming Code (e.g., are the first four bits 0s in the Extended Hamming Code form, or "0111" in the alternate extended quadratic residue code form?) and whether or not the shell bit indicates that the codeword is in shell 1 (e.g., is the shell bit a 1?). If these five bits indicate that the codeword is all 0s and it is in shell 1, then the rounded and inflated data point is set to the all-0s codeword of the eight-bit Extended Hamming Code. A rounded and inflated data point in shell 1 consists of all 0s with one bit being either a +2 or a −2.

The next step 72 is to change the coordinate in the rounded and inflated data point to a 2 that corresponds to the decimal equivalent of the three binary bits that represent the location of the 2 (e.g., bits six, seven, and eight).

The next step 73 is to determine the polarity of the 2 from the 2 polarity bit and change the 2 in the rounded and inflated data point accordingly.

The last step 74 is to replace the 2 with $\sqrt{2}$ in order to recover the data point. This is equivalent to multiplying each coordinate of the rounded and inflated data point by $1/\sqrt{2}$ Replacing a value with another value is more efficient that multiplying.

RECEPTION OF AN ALL-0s CODEWORD IN SHELL 2

Figure 8:
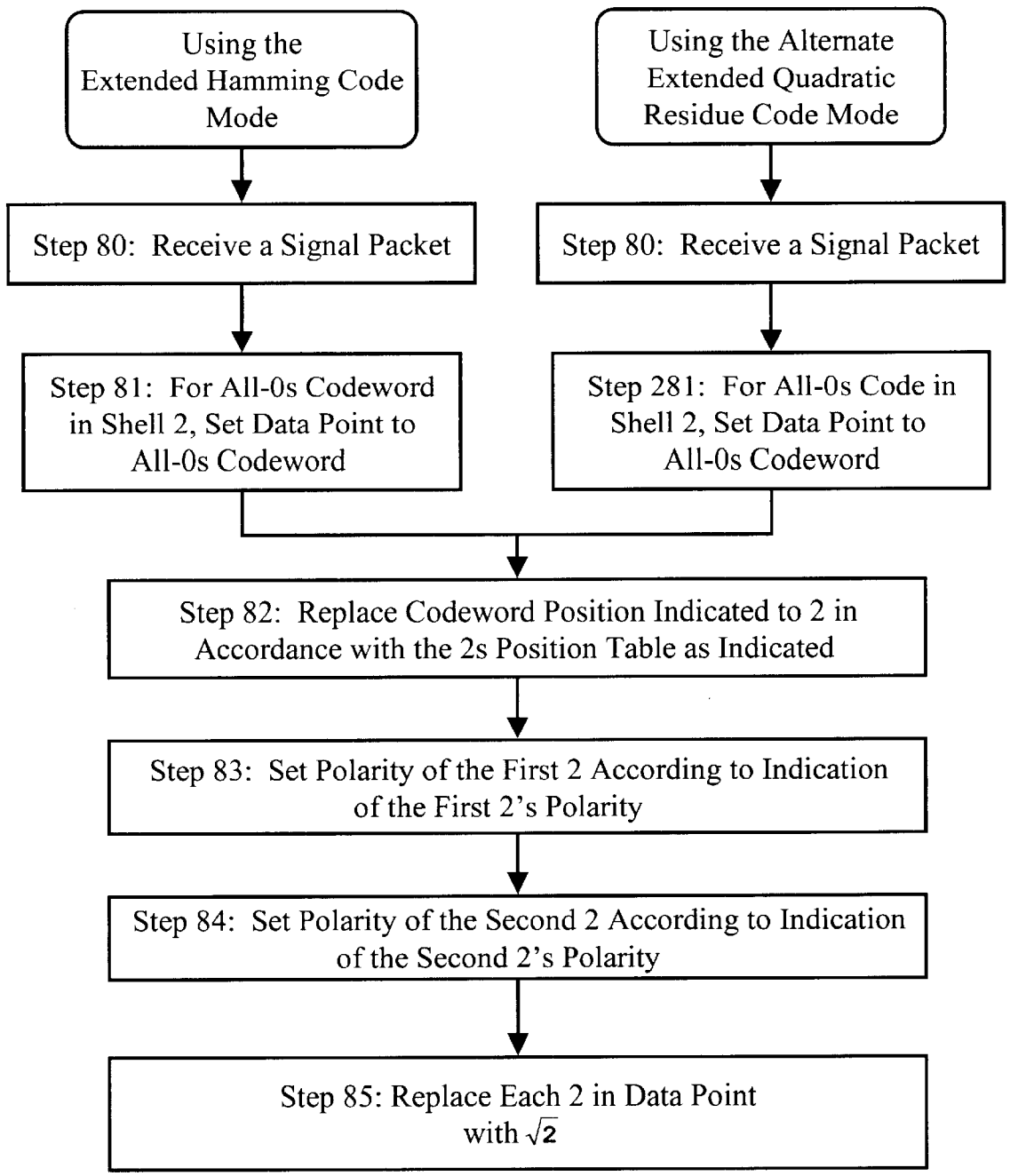
FIG. 8 is a list of steps for decoding a signal packet for an all-0s codeword in shell 2 according to two methods of the present invention.

FIG. 8 lists the steps that a receiver must perform in order to recover an all-0s codeword in shell 2, modify the codeword in order to recover the rounded and inflated data point on which the codeword is based, and recover the data point from the rounded and inflated data point The first step 80 is to receive the signal packet.

The next step 81 (step 281 when using the alternate extended quadratic residue code form) is to determine whether the signal packet represents an all-0s codeword in shell 2 (i. e., are the first four bits 0s in the Extended Hamming Code form, or "0111" in the alternate extended quadratic residue code form, and is the fifth bit a 0?). If these five bits indicate that the codeword is all 0s and is in shell 2, then the rounded and inflated data point is set to the codeword.

The next step 82 is to change two coordinates in the rounded and inflated data point to 2s according to five bits (e.g., bits six, seven, eight, nine, and ten) of the received signal packet. The five bits indicate where in a 2s position table may be found the two coordinates that must be changed to 2s. The 2s-position table stored by the receiver must be identical to the 2s-position table stored by the transmitter. In an alternate embodiment, an equation for the table may be used instead of the 2s-position look-up table. An equation would require some computation instead of merely a look up.

The next step 83 is to set the polarity of the first 2 in the rounded and inflated data point according to the polarity bit of the first 2 (e.g., the eleventh bit in the received signal packet).

The next step 84 is to set the polarity of the second 2 in the rounded and inflated data point according to the polarity bit of the second 2 (e.g., the twelfth bit in the received signal packet).

The last step 85 is to recover the data point from the rounded and inflated data point by replacing each 2 with $\sqrt{2}$. A replacement value must have the same polarity as the value it is replacing. Replacement here is equivalent to multiplying each coordinate of the rounded and inflated data point by $1/\sqrt{2}$. Replacement is much more efficient than multiplication.

RECEPTION OF AN ALL-1s CODEWORD IN SHELL 2

Figure 9:
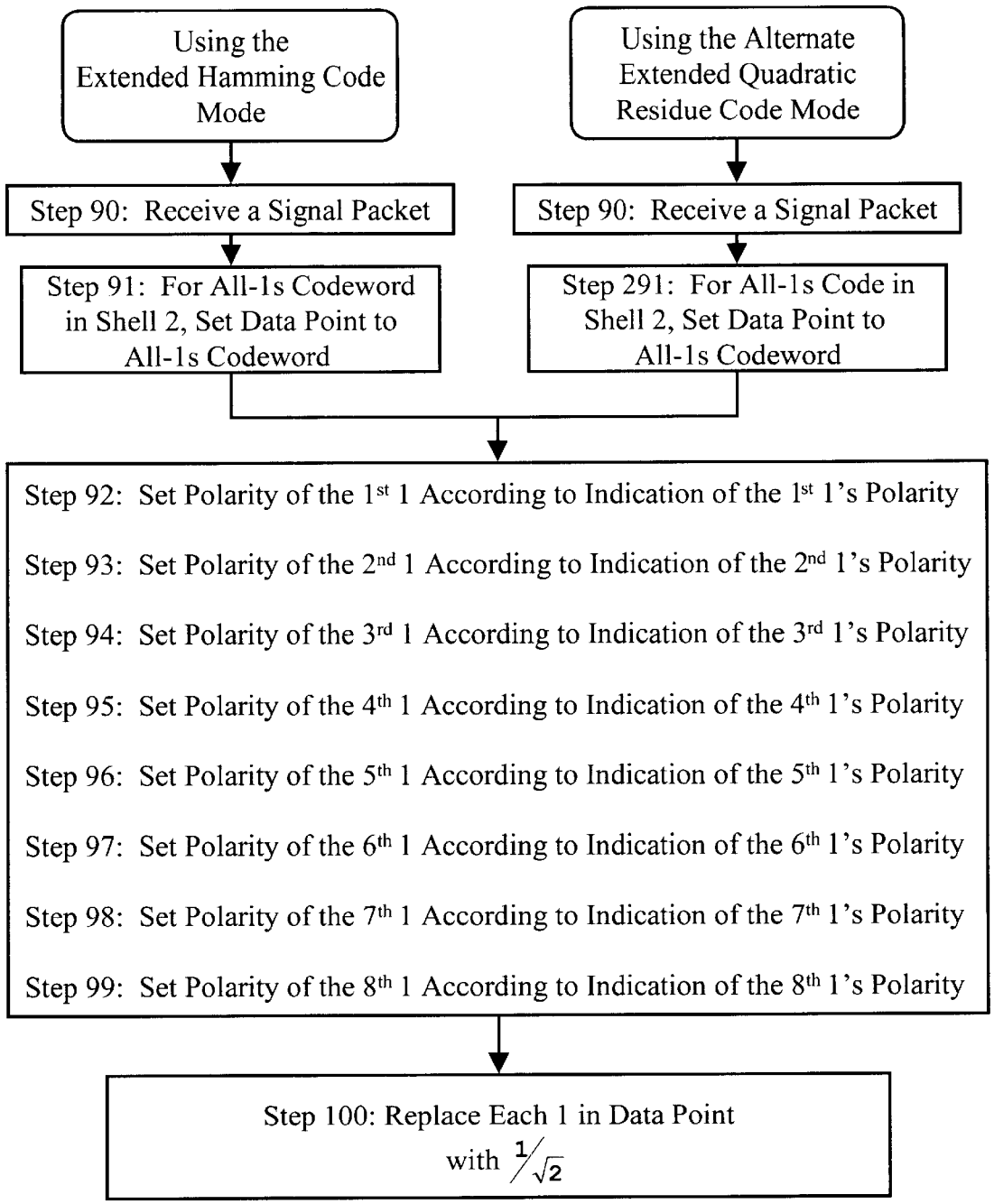
FIG. 9 is a list of steps for decoding a signal packet for an all-1s codeword in shell 2 according to two methods of the present invention.

FIG. 9 lists the steps that a receiver must perform in order to recover an all-1s codeword in shell 2, modify the codeword in order to recover the rounded and inflated data point on which the codeword is based, and recover the data point from the rounded and inflated data point The first step 90 is to receive a signal packet.

The next step 91 (step 291 when using the alternate extended quadratic residue code form) is to determine whether or not four bits (e.g., the first four bits) represent the all-1s codeword of the eight-bit Extended Hamming Code (e.g., are all 1s?).

If these four bits indicate that the codeword is all-1s, then the rounded and inflated data point is set to the all-1s codeword An inflated data point based on an all-1s codeword consists of all 1 s, where each 1 may be positive or negative.

The next step 92 is to set the polarity of the first 1 in the rounded and inflated data point according to the first polarity bit (e.g., the fifth bit) in the received signal packet.

The next step 93 is to set the polarity of the second 1 in the rounded and inflated data point according to the second polarity bit (e.g., the sixth bit) in the received signal packet.

The next step 94 is to set the polarity of the third 1 in the rounded and inflated data point according to the third polarity bit (e.g., the seventh bit) in the received signal packet.

The next step 95 is to set the polarity of the fourth 1 in the rounded and inflated data point according to the fourth polarity bit (e.g., the eighth bit) in the received signal packet.

The next step 96 is to set the polarity of the fifth 1 in the rounded and inflated data point according to the fifth polarity bit (e.g., the ninth bit) in the received signal packet.

The next step 97 is to set the polarity of the sixth 1 in the rounded and inflated data point according to the sixth polarity bit (e.g., the tenth bit) in the received signal packet.

The next step 98 is to set the polarity of the seventh 1 in the rounded and inflated data point according to a seventh polarity bit (e.g., the eleventh bit) in the received signal packet.

The next step 99 is to set the polarity of the eighth and last 1 in the rounded and inflated data point according to the eighth polarity bit (e.g., the twelfth bit) in the received signal packet.

The last step 100 is to replace each 1 in the rounded and inflated data point by $1/\sqrt{2}$ in order to recover the data point. The polarity of the replacement value must be the same polarity as the value being replaced Replacement here is equivalent to multiplying each coordinate of the rounded and inflated data point by $1/\sqrt{2}$. Replacement is much more efficient than multiplication.

RECEPTION OF A WEIGHT-FOUR CODEWORD IN SHELL 1

Figure 10:
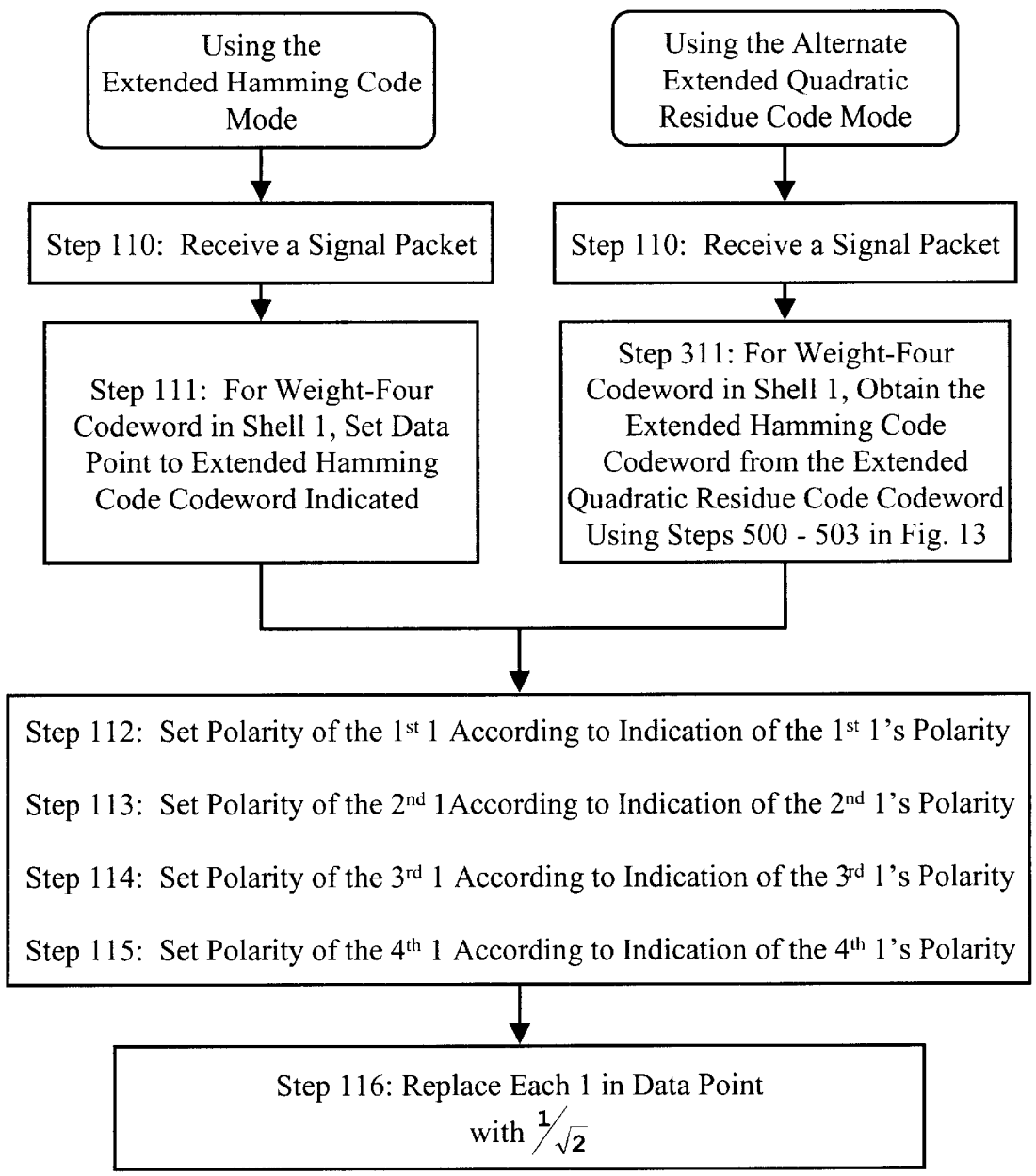
FIG. 10 is a list of steps for decoding a signal packet for a weight-four codeword in shell 1 according to two methods of the present invention.

FIG. 10 lists the steps that a receiver must perform in order to recover a codeword of weight four in shell 1, modify the codeword in order to recover the rounded and inflated data point on which the codeword is based, and recover the intended data point from the rounded and inflated data point A rounded and inflated data point in shell 1 consists of four 1 s and four 0s distributed therein, where the 1s may be positive or negative.

The first step 110 is to receive a signal packet.

The second step 111 (step 311 when using the alternate extended quadratic residue code form) is to determine whether or not four bits (e.g., the first four bits) indicate that the codeword is of weight four; a fifth bit (e.g., the fifth bit)

indicates that the codeword is in shell 1. If so, the rounded and inflated data point is set to the codeword in the eight-bit Extended Hamming Code at the position indicated by the four bits in the Extended Hamming Code mode or the eight-bit Extended Hamming Code is obtained from the four bit alternate extended quadratic code mode codeword encoding in the alternate extended quadratic residue code mode of the present invention.

The next step 112 is to set the polarity of the first 1 in the rounded and inflated data point according to the first polarity bit (e.g., the sixth bit) in the received signal packet.

The next step 113 is to set the polarity of the second 1 in the rounded and inflated data point according to the second polarity bit (e.g., the seventh bit) in the received signal packet.

The next step 114 is to set the polarity of the third 1 in the rounded and inflated data point according to the third polarity bit (e.g., the eighth bit) in the received signal packet.

The next step 115 is to set the polarity of the fourth 1 in the rounded and inflated data point according to the fourth polarity bit (e.g., the ninth bit) in the received signal packet.

The last step 116 is to replace each 1 in the rounded and inflated data point with $1/\sqrt{2}$. The polarity of each replacement value must be the same polarity as the value that it replaces. By replacing each 1 in the rounded and inflated data point as described above, the data point is recovered from the rounded and inflated data point.

RECEPTION OF A WEIGHT-FOUR CODEWORD IN SHELL 2

Figure 11:
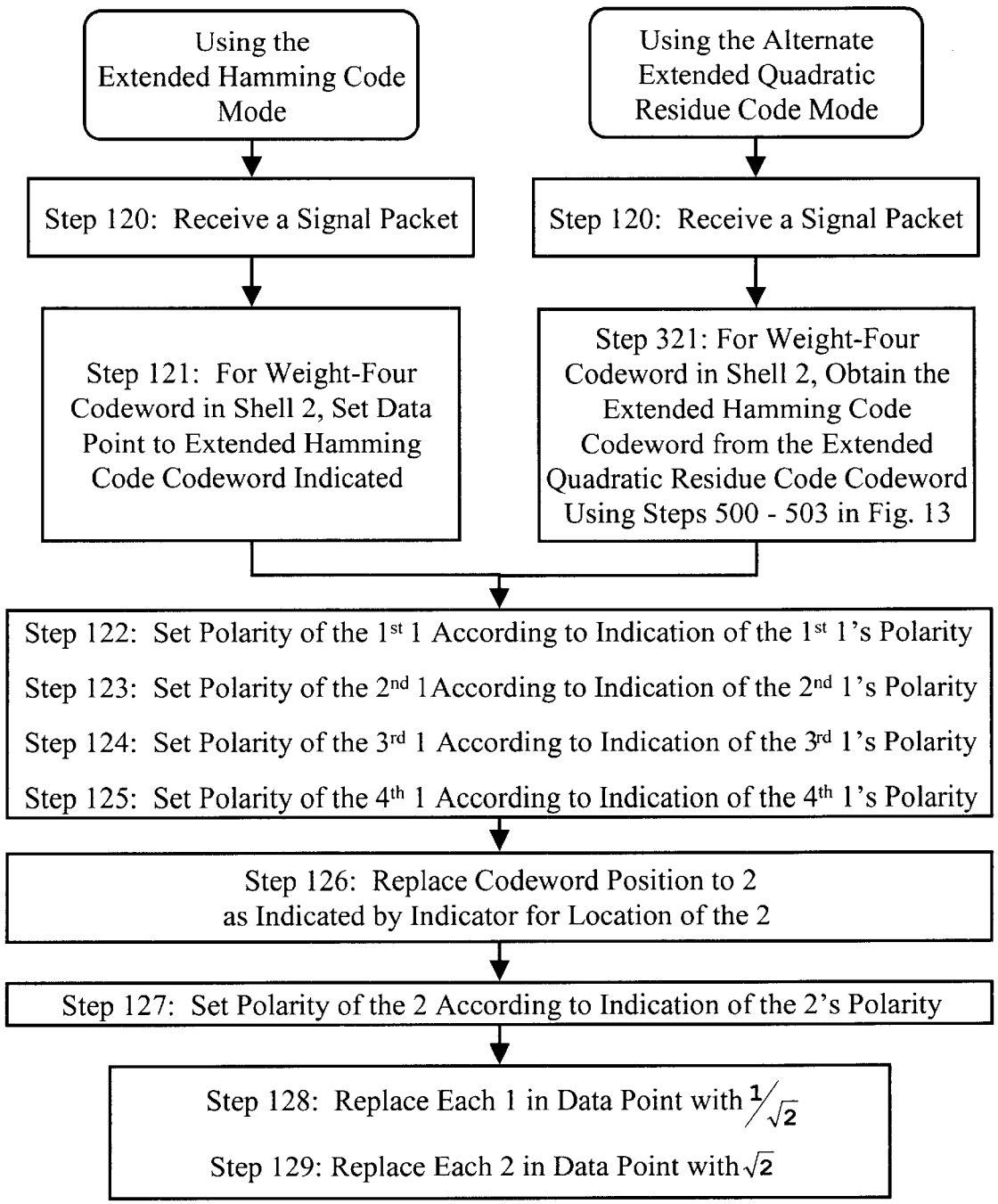
FIG. 11 is a list of steps for decoding a signal packet for a weight-four codeword in shell 2 according to two methods of the present invention.

FIG. 11 lists the steps that a receiver must perform in order to recover a codeword of weight four in shell 2, modify the codeword in order to recover the rounded and inflated data point on which the codeword is based, and recover the data point from the rounded and inflated data point A rounded and inflated data point of weight four in shell 2 consists of four 1s, three 0s, and one 2 distributed therein, where each 1 and the 2 may be either positive or negative. This may be thought of as a rounded and inflated data point consisting of four 1s and four 0s, where one of the 0s is changed to a 2.

The first step 120 is to receive a signal packet.

The second step 121 (step 321 when using the alternate extended quadratic residue code form) is to determine whether or not four codeword position bits (e.g., the first four bits in the received signal packet) represent a codeword of weight four and a fifth bit (e.g., the fifth bit in the received signal packet) indicates that the codeword is in shell 2. If the codeword is of weight four and in shell 2 then the rounded and inflated data point is set to the codeword at the position in the eight-bit Extended Hamming Code represented by the four bits in the Extended Hamming Code mode or the eight-bit Extended Hamming Code is obtained from the four bit alternate extended quadratic code mode codeword encoding in the alternate extended quadratic residue code mode of the present invention.

The next step 122 is to set the polarity of the first 1 in the rounded and inflated data point according to the first polarity bit (e.g., the sixth bit) in the received signal packet.

The next step 123 is to set the polarity of the second 1 in the rounded and inflated data point according to the second polarity bit (e.g., the seventh bit) in the received signal packet.

The next step 124 is to set the polarity of the third 1 in the rounded and inflated data point according to the third polarity bit (e.g., the eighth bit) in the received signal packet.

The next step 125 is to set the polarity of the fourth 1 in the rounded and inflated data point according to the fourth polarity bit (e.g., the ninth bit) in the received signal packet.

The next step 126 is to change the 0 in the rounded and inflated data point to a 2 according to the position represented by two 2s position bits (e.g., bits ten and eleven in the received signal packet).

The next step 127 is to set the polarity of the 2 in the rounded and inflated data point according to the 2 polarity bit (e.g., the twelfth bit) in the signal packet received.

The next step 128 is to replace each 1 in the rounded and inflated data point with $1/\sqrt{2}$. The polarity of each replacement value must be the same polarity as the value that it replaces.

The last step 129 is to replace each 2 in the rounded and inflated data point with $\sqrt{2}$. By replacing each 1 and each 2 in the rounded and inflated data point as described above, the data point is recovered from the rounded and inflated data point.

Although various preferred embodiments and methods of the present invention have been described herein in detail to provide for complete and clear disclosure, it will be appreciated by those skilled in the art, that variations may be made thereto without departing from the spirit of the invention or the scope of the appended claims.

What is claimed is:

1. A method of lattice-quantizing an eight-long data point in a manner that minimizes storage requirements, comprising the steps of:
   a) acquiring the eight-long data point;
   b) multiplying each coordinate of the data point by the square root of two to form an inflated data point;
   c) rounding each coordinate of the inflated data point to the nearest integer;
   d) modulo-two reducing each coordinate of the rounded inflated data point to form an initial codeword;
   e) creating a signal packet, wherein said step of creating a signal packet is comprised of the steps of:
   constructing a signal packet, if the initial codeword is an all-0s codeword in shell 1,
      having four bits set to an all-0s code,
      having one bit to indicate that the rounded and inflated data point is in shell 1,
      having three bits to indicate which bit in the rounded and inflated data point must be changed to a 2, and
      having one bit to indicate the polarity of the 2;
   constructing a signal packet, if the initial codeword is an all-0s codeword in shell 2,
      having four bits set to an all-0s code,
      having one bit to indicate that the rounded and inflated data point is in shell 2,
      having five bits to indicate the position in a table where the locations in the rounded and inflated data point that must be changed to 2 can be found;
      having one bit to indicate the polarity of the first 2; and
      having one bit to indicate the polarity of the second 2;
   constructing a signal packet, if the initial codeword is an all-1s codeword in shell 2,
      having four bits set to an all-1s code,
      having one bit to indicate the polarity of a first 1 in the rounded and inflated data point,
      having one bit to indicate the polarity of a second 1 in the rounded and inflated data point, having one bit to indicate the polarity of a third 1 in the rounded and inflated data point, having one bit to indicate the polarity of a fourth 1 in the rounded and inflated data point, having one bit to indicate the polarity of a fifth 1 in the rounded and inflated data point, having one bit to indicate the polarity of a sixth 1 in the rounded and inflated data point, having one bit to indicate the polarity of a seventh 1 in the rounded and inflated data point, and having one bit to indicate the polarity of an eighth 1 in the rounded and inflated data point;

constructing a signal packet, if the initial codeword is a weight-four codeword in shell 1, having four bits set to indicate an extended quadratic residue code codeword from which an Extended Hamming Code codeword may be calculated, having one bit to indicate that the rounded and inflated data point is in shell 1, having one bit to indicate the polarity of a first 1 in the rounded and inflated data point, having one bit to indicate the polarity of a second 1 in the rounded and inflated data point, having one bit to indicate the polarity of a third 1 in the rounded and inflated data point, and having one bit to indicate the polarity of a fourth 1 in the rounded and inflated data point;

constructing a signal packet, if the initial codeword is a weight-four codeword in shell 2, having four bits set to indicate an extended quadratic residue code codeword from which an Extended Hamming Code codeword may be calculated, having one bit to indicate that the rounded and inflated data point is in shell 2, having one bit to indicate the polarity of a first 1 in the rounded and inflated data point, having one bit to indicate the polarity of a second 1 in the rounded and inflated data point, having one bit to indicate the polarity of a third 1 in the rounded and inflated data point, and having one bit to indicate the polarity of a fourth 1 in the rounded and inflated data point, having two bits to indicate which 0 in the rounded and inflated data point must be changed to a 2, and having one bit to indicate the polarity of the 2; and f) transmitting the signal packet to a receiver.

2. The method of claim 1, further comprising the steps of:

a) receiving the signal packet transmitted at the receiver;

b) recovering the initial codeword from the four bits set to indicate an extended quadratic residue code codeword;

c) modifying the recovered codeword according to the signal packet in order to recover the inflated data point;

d) replacing each 1 in the rounded and inflated data point with the reciprocal of the square root of two of the same polarity; and e) replacing each 2 in the rounded and inflated data point with the square root of two of the same polarity in order to recover the data point.

3. The method of claim 1, wherein said step of modulo-two reducing each coordinate of the rounded inflated data point to form an initial codeword further comprises the steps of:

a) multiplying a parity-check matrix of an eight-bit Extended Hamming Code by the results of step (d), in claim 1, in the form of a column matrix to form a syndrome;

b) correcting any single-bit errors, if any, in the initial codeword; and c) correcting any double-bit errors, if any, in the initial codeword.

4. The method of claim 1, wherein said steps of having four bits set to indicate an extended quadratic residue code codeword from which an Extended Hamming Code codeword may be calculated further comprises the steps of:

a) acquiring an eight-bit Extended Hamming Code codeword;

b) complementing the eight-bit Extended Hamming Code codeword if the first bit is a 1;

c) transforming the result of step (b) into an extended quadratic residue code codeword;

d) setting one of said four bits to indicate if the eight-bit Extended Hamming Code codeword was complemented in step (b);

e) left circular shifting the first seven bits of the extended quadratic residue code codeword until a stored extended quadratic code codeword is obtained; and f) setting three of said four bits to indicate the number of left circular shifts performed in step (e).

5. The method of claim 2, wherein said step of recovering the initial codeword from the four bits set to indicate an extended quadratic residue code codeword further comprises the steps of:

a) acquiring the four bits set to indicate an extended quadratic residue code;

b) right circular shifting the first seven bits of a stored extended quadratic code codeword the number of times indicated by three of the four bits;

c) transforming the result of step (1) into an Extended Hamming Code codeword; and d) complementing the Extended Hamming Code codeword if indicated by one of the four bits.

* * * * *